United States Patent
Wu et al.

(10) Patent No.: US 8,358,415 B2
(45) Date of Patent: Jan. 22, 2013

(54) APPARATUS AND SYSTEM FOR A QUASI LONGITUDINAL MODE ELECTRO OPTIC SENSOR FOR HIGH POWER MICROWAVE TESTING

(75) Inventors: Dong Ho Wu, Olney, MD (US); Anthony Garzarella, Ellicott City, MD (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 398 days.

(21) Appl. No.: 12/829,298

(22) Filed: Jul. 1, 2010

(65) Prior Publication Data

US 2010/0264904 A1    Oct. 21, 2010

Related U.S. Application Data

(63) Continuation-in-part of application No. 12/205,766, filed on Sep. 5, 2008, now Pat. No. 7,920,263.

(60) Provisional application No. 61/222,463, filed on Jul. 1, 2009.

(51) Int. Cl.
*G01J 4/00* (2006.01)
*G01R 31/00* (2006.01)

(52) U.S. Cl. .......................... 356/365; 324/96

(58) Field of Classification Search .................. None
See application file for complete search history.

(56) References Cited

U.S. PATENT DOCUMENTS

| | | | |
|---|---|---|---|
| 4,563,093 A | 1/1986 | Tada et al. | |
| 5,278,499 A | 1/1994 | Ito et al. | |
| 5,305,136 A | 4/1994 | Smith | |
| 5,737,082 A | 4/1998 | Itatani et al. | |
| 5,963,034 A | 10/1999 | Mahapatra et al. | |
| 6,353,494 B1 | 3/2002 | Hamada | |
| 6,404,538 B1 | 6/2002 | Chen et al. | |
| 6,621,258 B2 | 9/2003 | Davidson et al. | |
| 6,677,769 B2* | 1/2004 | Whitaker et al. | 324/96 |
| 6,952,107 B2* | 10/2005 | Rahmatian | 324/96 |
| 7,336,062 B2 | 2/2008 | Mitrofanov | |
| 7,493,047 B2* | 2/2009 | Shinagawa et al. | 398/135 |

(Continued)

OTHER PUBLICATIONS

Copenheaver, Blaine R.; International Search Report; Sep. 1, 2010; pp. 1-5; International Searching Authority, Alexandria, VA; USA.

(Continued)

*Primary Examiner* — Gregory J Toatley
*Assistant Examiner* — Juan D Valentin, II
(74) *Attorney, Agent, or Firm* — Amy L. Ressing; John L. Young

(57) ABSTRACT

An apparatus, for measuring an applied electrical field and for reducing perturbation to the electrical field being measured, includes a laser integrated into an electro optic crystal sensor head prior to the output fiber. A probe beam is passed along the crystal direction of low birefringence of nearly circular optical indicatrix, rather than one of high EO modulation. The EO crystal is placed between two crossed polarizers and oriented such that a small tilt angle is subtended between its optic axis and the path of the probe beam. Improved optical coupling is achieved by using a large core multimode fiber at the output, to reduce optical insertion losses. A collimating lens emits the intensity modulated laser beam back to a photodetector, where the intensity modulated laser beam is converted to an electrical signal representing both field strength and phase of the electrical field applied to the sensor head.

20 Claims, 16 Drawing Sheets

U.S. PATENT DOCUMENTS

| | | | |
|---|---|---|---|
| 2002/0036491 | A1 | 3/2002 | Whitaker et al. |
| 2005/0083535 | A1 | 4/2005 | Kamshilin et al. |
| 2006/0152209 | A1 | 7/2006 | Sasaki et al. |
| 2009/0053558 | A1 | 2/2009 | Abbott et al. |
| 2009/0066952 | A1 | 3/2009 | Wu et al. |

OTHER PUBLICATIONS

Copenheaver, Blaine R.; Written Opinion of the International Searching Authority; Sep. 1, 2010; pp. 1-5; International Searching Authority, Alexandria, VA; USA.

Wu et al. (edited by John L. Young); Amendments and Statement Under Article 19 in Response to International Search Report and Written Opinion of the International Searching Authority; Oct. 15, 2010; pp. 1-22; US Naval Research Laboratory; Washington, DC; USA.

A. Garzarella, S.B. Qadri, and Dong Ho Wu; Optimal electro-optic sensor configuration for phase noise limited, remote field sensing applications; Jun. 5, 2009; pp. 1-3; vol. 94; Applied Physics Letters; USA.

A. Garzarella, Dong Ho Wu; Electro-Optic Sensors for High Power Microwave Applications; Mar. 16-20, 2009; pp. 1-3; vol. 94; APS Meetings; Pittsburgh; USA.

A. Garzarella, Dong Ho Wu; Nonperturbative detection of high power microwaves using fiber attached electro-optic sensors (I); 2008; pp. 1-4; Optical Society of America; USA.

A. Garzarella, Dong Ho Wu; Nonperturbative detection of high power microwaves using fiber attached electro-optic sensors (II); 2008; pp. 1-17; CLEO; USA.

A. Garzarella, Dong Ho Wu; Nonperturbative, 3-axis electric field measurements using electro-optic sensors (III); Jul. 2-6, 2008; pp. 1-23; PIERS; Cambridge, USA.

A. Garzarella, Dong Ho Wu; Abstract Nonperturbative, 3-axis electric field measurements using electro-optic sensors (IV); Jul. 2-6, 2008; p. 1; PIERS; Cambridge, USA.

A. Garzarella, S.B. Qadri, Dong Ho Wu, and R.J. Hinton; Responsivity optimization and stabilization in electro-optic field sensors; Sep. 10, 2007; pp. 1-5; vol. 46; No. 26; Applied Optics; Optical Society of America; USA.

Dong Ho Wu; NRL Invention Evaluation Board Presentation "Commercialization"; Aug. 2009; pp. 1.17; US Naval Research Laboratory; Washington, DC; USA.

P. Ganopadhyay et al.; A sub-nanotesla ;magnetic field sensor using in-plane propagation of light in a negative-anisotropy garnet film; 2009; pp. 1-2; Optical Society of America; USA.

S. Sriram; High Frequency Electric Field Sensors using Thin-Film Electro-optical Ferroelectric Relaxors; Jun. 2008; pp. 1-7; Columbus, OH, USA.

A. Garzarella and Dong Ho Wu; Non Perturbing Electric Field Measurements Using Photorefractive Electro-optic Sensors; Sep. 25-27, 2007; pp. 1-18 (Slides); ASNR; Gramat, France.

Wu, Garzarella, and Wieting; Ultra broadband electro-optic field-sensor; Aug. 7-10, 2006; pp. 1-4; Conference Proceedings of ITEA Technology Review, Cambridge, MA; USA.

Wu, Garzarella, and Wieting; Ultra broadband electro-optic field-sensor; 2006; pp. 1-10 (Slides); ASNR Conference Proceedings.

Garzarella, Qadri, Wieting and Wu; Spatial and termporal sensitivity variations in photorefractive electro-optic field sensors; Applied Physics Letters 88; Apr. 5, 2006; pp. 141106-1 and 141106-2; USA.

Garzarella, Qadri, Wieting and Wu; Piezo-induced sensitivity enhancements in electro-optic field sensors; Applied Physics Letters 98; Aug. 25, 2005; pp. 043113-1 and 0431136-2; USA.

Garzarella, Qadri, Wieting and Wu; The effects of photorefraction on electro-optic field sensors; Applied Physics Letters 97; Jun. 10, 2005; pp. 113108-1 and 113108-5; USA.

Wu, Garzarella, and Wieting; Electro-optic field sensor development at the U.S. Naval Research Laboratory at Four Power ASNR HPM LTTP Technical Meeting in Germany; Apr. 5, 2006; pp. 1-36 (Slides);Germany;.

\* cited by examiner

APPARATUS AND SYSTEM FOR A QUASI LONGITUDINAL MODE ELECTRO OPTIC SENSOR FOR HIGH POWER MICROWAVE TESTING

RELATED APPLICATIONS

Pursuant to 35 USC §120, the present application is related to and a continuation-in-part (CIP) of and claims the benefit of priority to U.S. Non-Provisional patent application Ser. No. 12/205,766, filed on Sep. 5, 2008, published application U.S. Patent Application Publication No. 2009-0066952, now issued U.S. Pat. No. 7,920,263, herein incorporated by reference in its entirety. Also, pursuant to 35 U.S.C. §119, the present application is related to and claims the benefit of priority to U.S. Provisional Patent Application 61/222,463 filed Jul. 1, 2009 which is herein incorporated by reference in its entirety.

FIELD OF THE INVENTION

The present invention is generally related to high power microwave test and evaluation. In particular the present invention is directed to an optical electromagnetic field sensor.

A fundamental modification in the design of the optical fiber (EO) sensor is the subject of the exemplary embodiments described herein. The details of this new sensor structure are explained later in the exemplary embodiments. The new sensor enables the use of long optical fibers, and embodiments demonstrate that this new sensor design is indeed a practical one for a high power microwave (HPM) test and evaluation (T&E).

BACKGROUND OF THE INVENTION

Several different technologies have been exploited in the past for measuring the strength of high power microwave (HPM) electric fields. D-dot sensors represent the original and most common technology used. More recently, however, field sensors based on electro optic technology have been reported. One type of electro-optic (EO) sensor is based on Mach-Zehnder interferometric technique, and the other type is the EO sensor described in related U.S. patent application Ser. No. 12/205,766, which is based on a polarimetric technique.

Presently D-dot and B-dot sensor probes are used for high power microwave test and evaluation (HPM T&E), where a D-dot sensor is a dipole antenna capable of measuring an electrical field, while a B dot sensor is a coil or loop used for measuring a magnetic field.

The D-dot sensor, used as a dipole antenna, is attached to a copper-jacketed coaxial cable. Because the D-dot sensor itself contains metallic parts and makes use of a coaxial cable, it inevitably perturbs the field that it measures. Thus, because of this perturbation, the D-dot sensor is unable to measure the true field accurately.

Limitations and disadvantages of the conventional D-dot and B-dot sensors include: (1) unacceptably large field perturbations, (2) narrow bandwidth, and (3) bulky physical size. Both the D-dot and the B-dot sensors are composed of metallic parts, and hence they perturb fields that they measure, based on the metallic composition of the sensors. The large field perturbations render these sensors unable to accurately measure true electrical and magnetic fields.

D-dot sensors have relatively narrow frequency bandwidths, typically less than 1 GHz; hence they are unsuitable for many wideband or ultra-wideband HPM field tests. In addition, conventional electric-field sensors (such as D-dot sensors) are relatively large in size; hence they are unable to measure the smaller details in an electric field pattern, or to detect fields in enclosed spaces containing electronic circuits. In fact, early attempts to characterize the microwave radiation inside a cavity using a D-dot sensor completely failed because of the above limitations and design problems.

Electro-optic (EO) sensors, used for the nonperturbative detection of electric fields, are typically configured to modulate an optical probe beam along a crystal direction in which the EO tensor coefficient is largest. However in fiber optic EO sensors, such configurations can be strongly limited by phase noise and cumbersome compensation optics. A greater signal to noise ratio can be achieved by modulating along a crystal direction of low static birefringence, even when the active EO tensor coefficient is several times smaller.

The use of electro-optic (EO) crystals in electric field measurement applications has gained considerable momentum over recent years. This is due to their compact size (<1 cm$^3$), large dynamic range (~1 MV/m), large intrinsic bandwidths (DC-THz), and ability to simultaneously measure both field amplitude and phase. EO field sensors measure electric fields through a phase modulation induced in a probe beam passing through a nonlinear crystal. The phase modulation is due to a distortion of the optical indicatrix (linear EO effect), and is converted to a beam intensity modulation using an analyzer (polarizer). The modulation depth is directly proportional to the applied field, allowing the field to be directly measured (within a proportionality factor) using a photodetector. Unlike conventional metallic field probes, EO sensors are all-dielectric and can be utilized in large electric fields or high power microwave (HPM) fields. In spite of these advantages, metallic probes are still predominantly used, while EO sensors are usually confined to more research-oriented laboratory applications. One reason for this is that EO sensors are susceptible to phase noise and sensitivity losses that are greatly compounded when extended lengths of optical fiber (e.g., 50 meters) are used. The use of long optical fibers is often unavoidable in field testing, especially at HPM test sites where the readout instruments must be remotely isolated to avoid interference from stray or reflected fields.

Noise level generally increases linearly with the length of the fiber. Investigations have revealed that the noise originates in the phase of the optical signal. This was determined by examining the noise in orthogonally polarized components of the probe beam using a Wollaston prism in place of the polarizer. These noise components exhibited equal and opposite amplitudes, indicating their origin in the phase of the optical signal. Because of the polarization dependence of the noise, subtracting the two signals (a common noise cancellation technique in commercial balanced photoreceivers) can not be effectively utilized.

In attempts to solve some of the above mentioned problems, an electro optic field sensor based on the Mach Zehnder interferometer technique has been invented. However, the Mach Zehnder electro optic sensor is incapable of measuring the phase or the waveform of the electrical and/or magnetic fields. The Mach-Zehnder sensor is also made of dielectric materials and optical fibers, but in contrast to the polarimetric design, the Mach-Zehnder sensor is also incompatible with long optical fibers.

Polarizers are traditionally used to analyze phase modulated probe beams, and convert them into intensity modulated optical signals.

Optical instabilities and/or small variations in the optical path length within a modulating medium (i.e., electro optic crystals and electro optic polymers) can produce amplitude fluctuations and phase fluctuations of an output optical signal. Constant manual adjustments of the traditional polarizer rotation angle can improve the stability to a certain degree; however, such manual adjustments are cumbersome and can not always recover the signal loss. No device hitherto exists to eliminate these instabilities and keep the device operating at its optimal responsivity.

Therefore, the need exists for devices and systems capable of measuring the phase and/or the waveform of electrical and/or magnetic fields, while reducing large field perturbations resulting from the metallic composition of measurement sensor probes.

Also, the need exists for less bulky physical sized devices and systems directed to measuring the phase and/or the waveform of electrical and/or magnetic fields, where these systems include wideband high power microwave test and evaluation capabilities.

Finally, the need exists for an EO sensor design suitable for HPM T&E, which does not generate polarization noise when long optical fibers are attached to the sensor.

SUMMARY OF THE INVENTION

An apparatus, for measuring an applied electrical field and for reducing perturbation to the electrical field being measured, includes a laser, a sensor head, and a photodetector. The sensor head is communicatively coupled to the laser and photodetector by optical fiber leads. In addition, the sensor head includes a holder, an electro optic crystal placed between a first collimating lens and a second collimating lens, also residing in the sensor head. The electro optic crystal and the first and second collimating lenses are mounted in the holder. The first collimating lens emits a laser beam transmitted from the laser to the sensor head, where the electrical field is applied and upon application of the laser probe beam to the electro optic crystal, the electro optic (EO) crystal transforms the laser probe beam into a phase modulated laser beam. In the electro optic crystal, the probe beam is passed along a crystal direction of low birefringence (i.e., a nearly circular optical indicatrix) rather than one of high EO modulation. The EO crystal is oriented such that a small tilt angle Theta ($\theta$) (~1°) is subtended between its optic axis and the path of the probe beam. This is done in order to produce a small, but stable zero field phase shift $\phi_0(\theta)$ within the probe beam, causing an improvement in EO signal stability. With such stability, the compensation optics used with the original EO sensor are no longer needed and the analyzer (P2) can be mounted in a fixed position within the sensor head, close to the EO crystal, i.e., prior to the output fiber; furthermore, a wave retardation plate or compensator is eliminated. Improved optical coupling is achieved by using a larger core multimode (MM) fiber in place of the polarization maintaining (PM) output fiber at the output, to reduce insertion losses. Further improvements can be made by replacing the Lithium Niobate ($LiNbO_3$) (also called "LN") crystal with a potassium dideuterium phosphate (KD*P) crystal. When implementing the modified sensor design with KD*P, sensitivity is increased by an additional factor of 3.5 due to its larger EO coefficient along the optic axis.

BRIEF DESCRIPTION OF THE DRAWINGS

FIG. 2B shows the same modulation signal, but with a cable that is 51.5 m long.

DETAILED DESCRIPTION OF THE INVENTION

Figure 1:
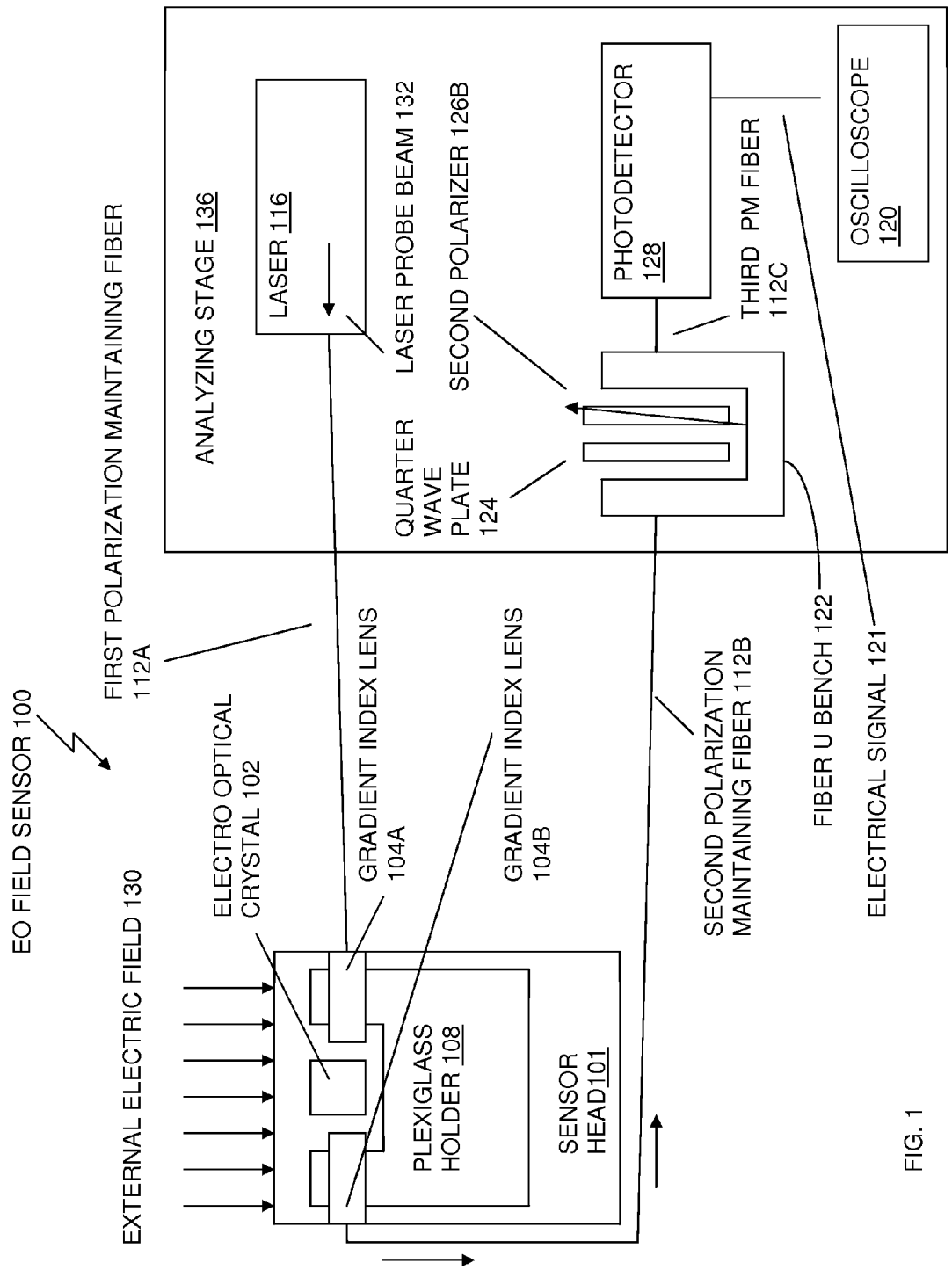
FIG. 1 illustrates an optical-fiber attached electro-optic field sensing apparatus for measuring an applied electromagnetic field using an electro optic (LN) sensor head, an analyzing stage and optical fibers for transmitting a laser probe beam between the sensor head and the analyzing stage.

Preferred exemplary embodiments of the present invention are now described with reference to the figures, in which like reference numerals are generally used to indicate identical or functionally similar elements. While specific details of the preferred exemplary embodiments are discussed, it should be understood that this is done for illustrative purposes only. A person skilled in the relevant art will recognize that other configurations and arrangements can be used without departing from the spirit and scope of the preferred exemplary embodiments. It will also be apparent to a person skilled in the relevant art that this invention can also be employed in other applications. Further, the terms "a", "an", "first", "second" and "third" etc. used herein do not denote limitations of quantity, but rather denote the presence of one or more of the referenced items(s). The instant application herein discloses a quasi-longitudinal-mode EO sensor employing an electro-optic crystal (for example, LiNbO$_3$ and KD*P). A transverse EO field sensor is shown in FIG. 1. Exemplary embodiments and associated features of the transverse EO field sensor (serving as background for the new quasi-longitudinal-mode EO sensor) are illustrated in FIG. 1 through FIG. 7 and described as follows: Referring to FIG. 1, the conventional optical fiber electro optic (EO) field sensor (hereafter "the EO field sensor 100"), which is complimentary to a free field EO sensor, is directed to the measurement of an external electrical field 130 in a confined space with a minimal perturbation to the external electrical field 130 being measured. The sensor head 101 and/or the sensor head 201 components of the EO field sensor 100 and EO field sensor 200 respectively are completely made of dielectric materials. Also, the sensor head 101 and the sensor head 201 can be configured to use optical fiber leads such as a first polarization maintaining fiber 112A (the first PM Fiber 112A), a second polarization maintaining fiber 112B (the second PM Fiber 112B), and a third polarization maintaining fiber 112C (the third PM Fiber 112C) to emit a measured signal to the various stages and components in the apparatus for measuring the external electrical field 130 applied to the sensor head 101, causing negligible perturbation of the external electrical field 130 by the EO field sensor 100 and optical fiber leads. Thus, the sensor head 101 and sensor head 201 of exemplary embodiments can be used for the test and evaluation of high power microwave (HPM) experiments, the diagnosis of radar and microwave devices (including microwave ovens), characterization of lightening and diagnosis of power lines, based on the negligible perturbation to the external electrical field 130 being measured.

Again, referring to FIG. 1, the sensor head is placed in the external electrical field 130 that is to be detected. A laser beam or probe beam (hereafter "laser probe beam 132") is emitted from a laser 116 in analyzing stage (hereafter "analyzing stage 136") to the sensor head 101 through a polarization maintaining (PM) optical fiber, such as polarization maintaining fiber 112A (hereafter "PM fiber 112A"). The laser probe beam 132 passes through an electro optic crystal 102 (hereafter "EO crystal 102"), and returns to the analyzing stage 136 through the second polarization maintaining fiber 112B (hereafter "the second PM fiber 112B"). The laser probe beam 132 passes through a quarter wave retardation plate (hereafter "quarter wave plate 124") (QWP) and an analyzer (a second polarizer 126B). A photodetector 128 then receives the laser probe beam 132 and converts the laser probe beam 132 into an electrical signal 121, which is displayed on an oscilloscope 120. Where, the electrical signal 121 can have at least two elements including a DC output element, such as a DC electrical signal 540 (DC Output) illustrated in FIG. 5, FIG. 8A, FIG. 10A, and FIG. 10D and an AC output element, such as an AC Electrical Signal 538 (RF Output) illustrated in FIG. 5, FIG. 8A, FIG. 10A, and FIG. 10D. The amplitude of the electrical signal 121 will be proportional to the amplitude of the external electrical field 130. The phase of the electrical signal 121 will precisely reproduce the phase of the external electrical field 130 applied to the sensor head 101. Thus, for any time varying external field E(t), such as the external electrical field 130, the electrical signal 121 output from the sensor will be $\alpha E(t)$, where $\alpha$ is a constant, depending on the laser power of the laser 116, conversion gain of the photodetector 128, and properties of the EO crystal 102. The quantity $\alpha$ is called the responsivity of the EO field sensor 100.

Referring to FIG. 1, the sensor head 101 consists of the EO crystal 102 and two gradient index (GRIN) lenses (hereafter "a first gradient index lens 104A" and "a second gradient index lens 104B"), all of which are mounted in a sample holder made of plexiglass (hereafter "plexiglass holder 108"). The total length of the sensor head 101 is approximately 3 cm (up to about 3 centimeters), which makes the sensor head 101 suitable to be placed in confined places, such as microwave wave guides.

Again referring to FIG. 1, a first GRIN lens, i.e., the first gradient index lens 104A is used to emit the laser probe beam 132 from the polarization maintaining fiber 112A into a collimated free space beam passing through the EO crystal 102. The first gradient index lens 104A is oriented such that polarization occurs in the laser probe beam 132 at a forty-five (45) degree angle with respect to the EO crystal 102 optic axis (also referred to as the "c axis 310") of the EO crystal 102 (see FIG. 3); then the laser probe beam 132, which has been polarized, propagates parallel to the x or y axis of the EO crystal 102, (where the y axis is hereafter referred to as "y axis 302") (see FIG. 3). The function of the EO crystal 102 is to modulate the probe beam polarization. The crystal can be composed of Lithium Niobate, or any other EO material with sufficient EO modulating power. In the absence of the external electrical field 130 applied, the natural birefringence of the EO crystal 102 converts the polarization state ($\phi$) of the laser probe beam 132 from linearly polarized ($\phi=0$) to elliptically polarized ($\phi=\phi_0$), (where birefringence is a state of double refraction exhibited by the decomposition of a ray of light into two rays of light, i.e., the ordinary ray of light and the extraordinary ray of light) caused when the original ray of light, such as from the laser probe beam 132, passes through certain types of material, such as the EO crystal 102, depending on the polarization of the light, when the structure of the EO crystal 102 is anisotropic (i.e., directionally dependent). Birefringence can be formalized by assigning two different refractive indices to the material of the EO crystal 102 for different polarizations. When the sensor head 101 is placed in the external electrical field 130, a small shift occurs in this elliptical polarization state ($\phi=\phi_0+\delta\phi$), which is eventually converted to the electrical signal 121 at the analyzer stage (such as the analyzer stage 136) downstream. A second GRIN lens (such as the second gradient index lens 104B) collects the phase modulated beam 400 (see FIG. 4 and FIG. 5), and launches the phase modulated beam 400 into a PM fiber (such as the second PM fiber 112B that carries the laser probe beam 132 back to the analyzing stage 136.

Referring again to the analyzing stage 136, as illustrated in FIG. 1, the laser 116 utilized for the EO field sensor 100 can range from 1 to 20 mW (milliwatts) in power and 530 to 1550 nm (nanometers) in wavelength. The laser probe beam 132 returning from the sensor head 101 is sent through the second PM fiber 112B to a fiber U bench 122. At the fiber U bench 122, the laser probe beam 132 exits the fiber and passes (in free space) through a quarter wave plate 124 and the analyzer (the second polarizer 126B). The quarter wave plate 124 is oriented with its fast and/or slow (fast/slow) axes at 45 degree angles with respect to the c axis 310 (optic axis) of the EO crystal 102 (see FIG. 3), to optimize responsivity. The analyzer (i.e., the second polarizer 126B) converts the shift in probe beam polarization (created by the external electrical field 130) into a modulation of beam intensity $\Delta P$. For optimal sensitivity, the position of the analyzer (i.e., the first polarizer 126A) must be calibrated (i.e., rotated) to optimize the modulation. The optimal set point of the analyzer (i.e., the first polarizer 126A) can be determined actively or passively. The sensor is actively calibrated by rotating the analyzer (i.e., rotating the second polarizer 126B) until the amplitude of the electrical signal 121 output from the photodetector 128 is maximized. Passive calibration is performed by rotating the analyzer (i.e., rotating the second polarizer 126B) until a specific quantity of total beam intensity reaches the photodetector 128 (determined from photodiode current monitor of the photodetector 128). Active calibration requires the sensor head 101 be placed in the external electrical field 130 applied for measurement; in contrast to this, passive calibration can be performed in the absence of the external electrical field 130. In the exemplary embodiments, calibration can be performed manually or through an automated rotation stage.

Once optimized, the modulation ΔP is given by:

$$\Delta P = P_0 \frac{\pi L n^3 r_{33}}{3\lambda} E, \quad (1)$$

where $P_0$ is the power of the laser probe beam 132 passing through the EO crystal 102, and L is the total optical path length of the laser probe beam 132 within the EO crystal 102, where n is the refractive index of the EO crystal 102, where $r_{33}$ is the electro optic coefficient of the EO crystal 102, where λ is the wavelength of the laser probe beam 132 emitted from the laser 116, and E is the value of the external electrical field 130. For $P_0$=1 mW, L=8 mm, n=2.2, $r_{33}$=25 pm/V and λ=1550 nm (these are typical operating parameters), the modulation per unit field, ΔP/E evaluates to be approximately 0.3 μW/kV/m.

Again referring to FIG. 1, the photodetector 128 converts the modulated beam intensity ΔP of the phase modulated beam 400 (see FIG. 4 and FIG. 5) into a modulated voltage signal ΔV, which can be viewed on the oscilloscope 120. Typical high speed (>GHz) photodetectors, such as photodetector 128, have conversion gains of the order 1000 V/W. Thus the responsivity of the EO sensor α=ΔV/E will be of the order of 0.3 mV/(kV/m) or 0.3 μm.

There are numerous advantages to the exemplary embodiment sensor design. First, the components of the sensor head 101 are free of metallic materials, and thus do no perturb the external electrical field 130 or fields that the sensor is designed to measure. Unlike conventional sensors, which detect only field strength of the external electrical field 130, the EO sensor 100 of the exemplary embodiments detects both field strength, (such as the amplitude of the electric field) and phase of the external electrical field 130 being measured. That is, the output signal from the sensor will be a precise reproduction of the field applied to the sensor head 101. Secondly, the sensor head 101 in the exemplary embodiments is approximately 3 cm long, which is much smaller than conventional B-dot and D-dot probes, making it useful for field detection inside a cavity (even in a very small cavity, including a cavity occupied with electronics). This enables measurement of fields in a confined microwave cavity or in a cavity where a power cable is placed.

The advantage of utilizing an integrated, optical fiber-attached sensor (compared with a independent free space sensor) is that the integrated, optical fiber-attached sensor embodiment eliminates the need for optical alignment between the various optical components and stages of any given system. Thus according to exemplary embodiments, the sensor is less sensitive to misalignments due to external vibrations. These features allow the sensor head 101 to be moved through the external electrical field 130 applied (such as, during spatial field mapping applications), without the need of constantly realigning the optics.

In preferred exemplary embodiments, maintaining the integrity and coherence of the beam polarization is of critical importance, because the sensor detects very small changes in polarization. The passage of the probe beam through the optical fibers, the first and second GRIN lenses and the U-benches presents vulnerabilities to the coherence of polarization and losses in responsivity. In preferred exemplary embodiments, the optical components of the invention were carefully chosen to minimize such vulnerabilities and/or losses.

The use of optical fiber allows for remote detection of an external field. As shown in FIG. 1, the sensor head 101 can simply be placed into the external electrical field 130 region, while the beam analysis/analyses and signal processing electronics can occur remotely from the external electrical field 130 (connected by optical fiber), thus, avoiding any possible exposure to the external (HPM) electrical field 130 and/or electrical interference.

Referring again to FIG. 1, the quarter wave plate 124 utilized in the fiber U bench 122 produces two additional advantages. Firstly, the utilization of the quarter wave plate 124 improves the sensor responsivity and stability over the traditional (crossed polarizer type) configuration by eliminating drifts in peak responsivity caused by changes in the birefringence of the EO crystal 102. Secondly, the utilization of the quarter wave plate 124 in the fiber U bench 122 allows the sensor to be passively calibrated by monitoring the transmitted beam power (photodiode current) in the photodetector 128. Thus, the sensor can be set to its most sensitive state and prepared for detection, prior to being placed in the external electrical field 130.

The electro optic field sensor is configured for use in high power microwave (HPM) test and evaluation environments. Therefore, due to advantages and new features, the electro optic field sensor can be used for many other purposes, including the diagnosis of radar and microwave devices, characterization of lightening and diagnosis of power lines.

Figure 2:
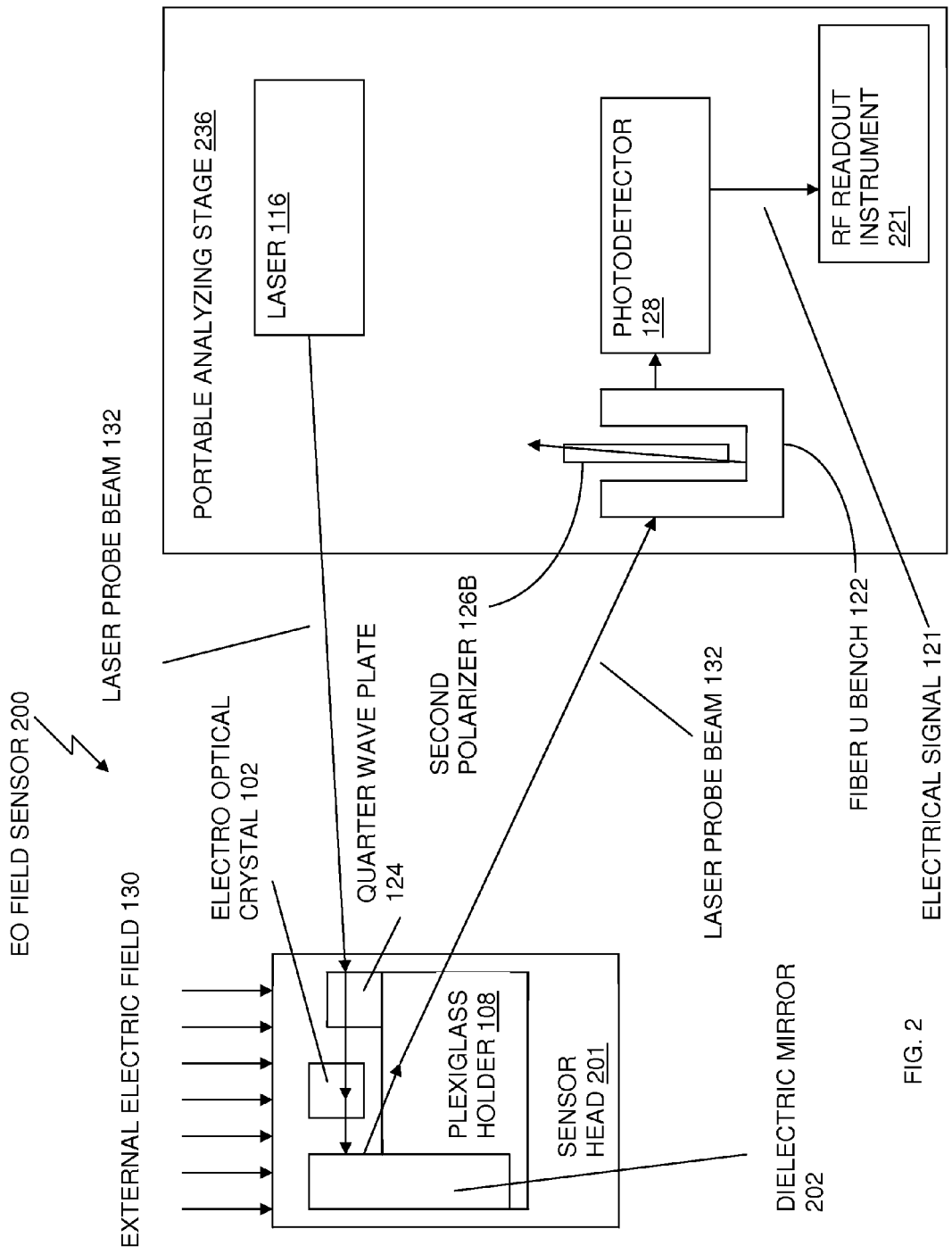
FIG. 2 illustrates a free-space reflection mode electro-optic field sensing apparatus for measuring an applied electric field using a sensor head, an analyzing stage and a free space laser probe beam communicatively coupling the sensor head to the analyzing stage.

In exemplary embodiments, referring to FIG. 2, illustrating EO field sensor 200, additional features of a sensor head 201 and a portable analyzing stage 236 are schematically illustrated, where the sensor head 201 is placed in the external electrical field 130 that is to be detected. A laser probe beam 132 is sent to the sensor head 201 remotely, from the portable analyzing stage 236. The laser probe beam 132 is reflected back to the portable analyzing stage 236 by a dielectric mirror 202 within the sensor head 201. The photodetector 128 receives the laser probe beam 132 (reflected back to the portable analyzing stage 236) and facilitates detecting and measuring the external electrical field 130 by converting the laser probe beam 132 to the electrical signal 121, which is displayed on the oscilloscope 120. The resulting amplitude of the electrical signal 121 will be proportional to the amplitude of the external electrical field 130. The resulting phase of the electrical signal 121 will be precisely reproduced from and identical to the phase of the external electrical field 130. Thus, for any time varying electrical field E(t), such as the external electrical field 130, the electrical signal 121 output from the sensor will be αE(t), where α is a constant, depending on the power of the laser 116, conversion gain of the photodetector 128, and properties of the EO crystal 102. The quantity α is called the responsivity of the EO field sensor. The second polarizer 126B, mounted in front of the photodetector 128 is used to calibrate and optimize the responsivity of the sensor.

Figure 3:
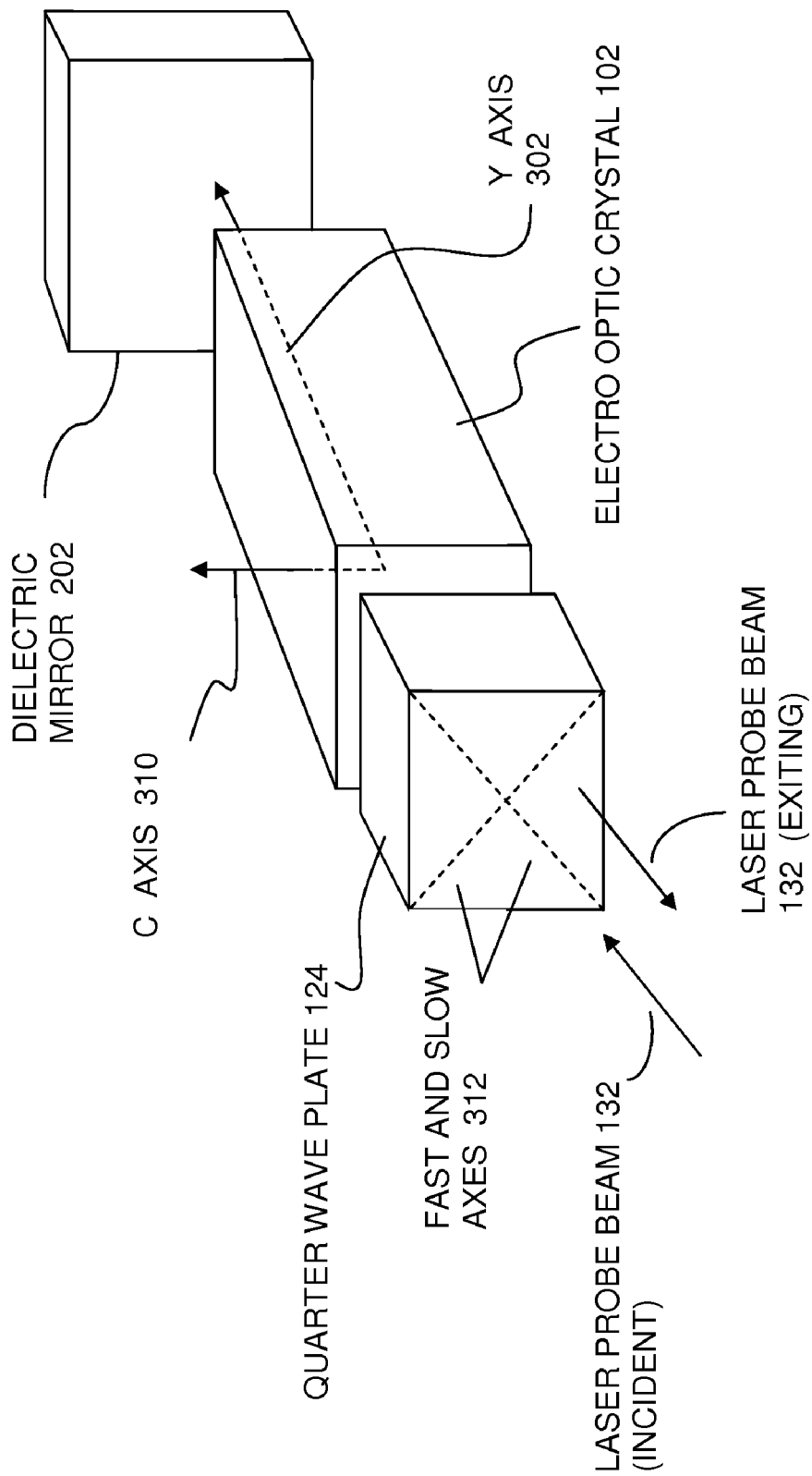
FIG. 3 illustrates an exploded view of the sensor head portion of the electro-optic field sensing apparatus shown in FIG. 2.

An exploded view of the components of the sensor head 201 is shown in FIG. 3 (also see FIG. 2), where the sensor head 201 consists of a quarter wave plate 124, the EO crystal 102 and the dielectric mirror 202, all of which are mounted in a plexiglass sample holder (not shown), such as the plexiglass holder 108. The total length of the sensor head 201 (including the plexiglass holder 108) is approximately 3 cm.

Again referring to FIG. 3 and FIG. 2, the quarter wave plate 124 is zero order, and oriented with its fast/slow axes 312 at 45 degree angles with respect to the c axis 310 (i.e., optic axis) of the EO crystal 102, and propagating along the crystalline y-axis. This configuration is used because it exploits the largest EO tensor coefficient ($r_{33}$) of the LiNbO$_3$ crystal, maximizing the optical modulation depth (m) for a given applied field. The laser probe beam 132, incident to the quarter wave plate 124, is linearly polarized at 45 degrees with respect to the c axis 310 of the EO crystal 102 (i.e., parallel to either the fast or slow axis of the fast/slow axes 312, of the quarter wave plate 124) and the laser probe beam 132 incident to the quarter wave plate 124, propagates parallel to the y axis 302 of the EO crystal 102. The function of the EO crystal 102 is to modulate polarization of the laser probe beam 132. If an EO crystal is able to produce an extraordinarily stable EO output over a long time period, then the direction of the optical axis of the EO crystal can be rotated so that the c-axis can be perpendicular to the probe beam. Thus in exemplary embodiments, the c axis 310 is perpendicular to the y axis 302.

In the exemplary embodiments, the material composing the EO crystal 102 can be Lithium Niobate (LiNbO$_3$), or any other EO material with sufficient EO modulating power.

In the absence of an external electrical field 130 applied, the natural birefringence of the EO crystal 102 converts the polarization state ($\phi$) of the laser probe beam 132 from linearly polarized ($\phi$=0) to elliptically polarized ($\phi$=$\phi_0$). When the sensor head 101 is placed in the external electrical field 130, a small shift occurs in this elliptical polarization state ($\phi$=$\phi_0$+$\delta\phi$), which is eventually converted to the electrical signal 121 at the analyzer stage downstream. The function of the dielectric mirror 202 is to increase the modulating power of the sensor head 101 by doubling the optical path-length L of the laser probe beam 132 within the EO crystal 102.

In accordance with exemplary embodiments, the components of the portable analyzing stage 236 are shown in FIG. 2. The laser 116 utilized for the EO field sensor 200 can range from between about 1 to 20 mW in power and between about 530 nm to 1550 nm in wavelength. The laser probe beam 132 (reflected from the dielectric mirror 202 and returning to the portable analyzing stage 236) passes through an analyzer (i.e., referred to herein as the second polarizer 126B) before being received by the photodetector 128. The analyzer (i.e., the second polarizer 126B) converts the shift in the laser probe beam 132 polarization (created by the external electrical field 130) into a modulation of beam intensity $\Delta P$. For optimal sensitivity, the position of the second polarizer 126B must be calibrated (rotated) to optimize the modulation. The optimal set point of the second polarizer 126B can be determined actively or passively. The EO sensor 200 is actively calibrated by rotating the second polarizer 126B until the amplitude of the electrical signal 121 output from the photodetector 128 is maximized. Passive calibration is performed by rotating the second polarizer 126B until a specific quantity of total beam intensity reaches the photodetector 128 (determined from a photodiode current monitor of the photodetector 128). Active calibration requires the device to be placed in the external electrical field 130 applied, while passive calibration can be performed in the absence of the external electrical field 130.

Once optimized, the modulation $\Delta P$ is given by:

$$\Delta P = P_0 \frac{\pi L n^3 r_{33}}{3\lambda} E, \quad (2)$$

Where $P_0$ is the beam power of the laser probe beam 132 passing through the EO crystal 102, L is the total optical path length of the laser probe beam 132 within the EO crystal 102, n is the refractive index of the EO crystal 102, $r_{33}$ is the electro optic coefficient of the EO crystal 102, $\lambda$ is the wavelength of the laser 116, and E is the value of external electrical field 130 applied. For $P_0$=0.5 mW, L=40 mm, n=2.2, $r_{33}$=20 pm/V, $\lambda$=633 nm (typical operating parameters), the modulation per unit of the external electrical field 130, AFIE evaluates to be approximately 1 $\mu$W/kV/m.

Figure 4:
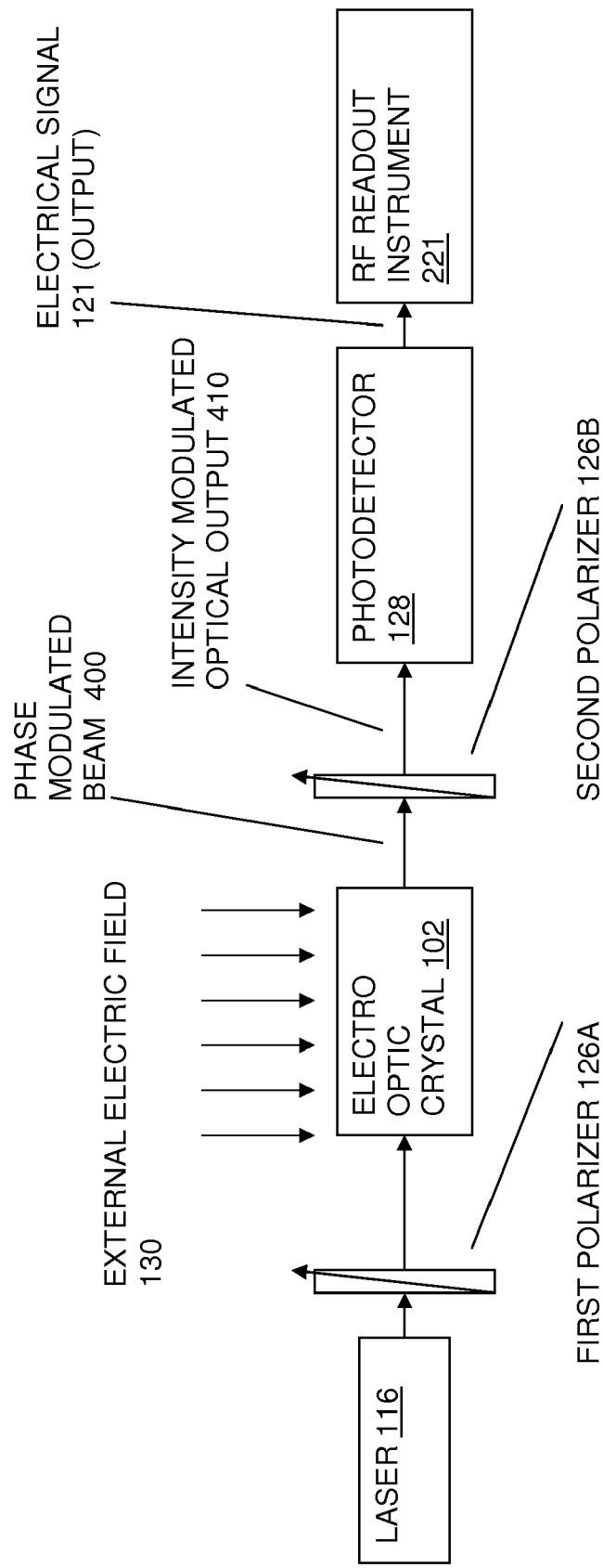
FIG. 4 illustrates a general optical modulation application according to the exemplary embodiments of the electro-optic field sensing devices for measuring an applied electric field, discussed herein.
Figure 5:
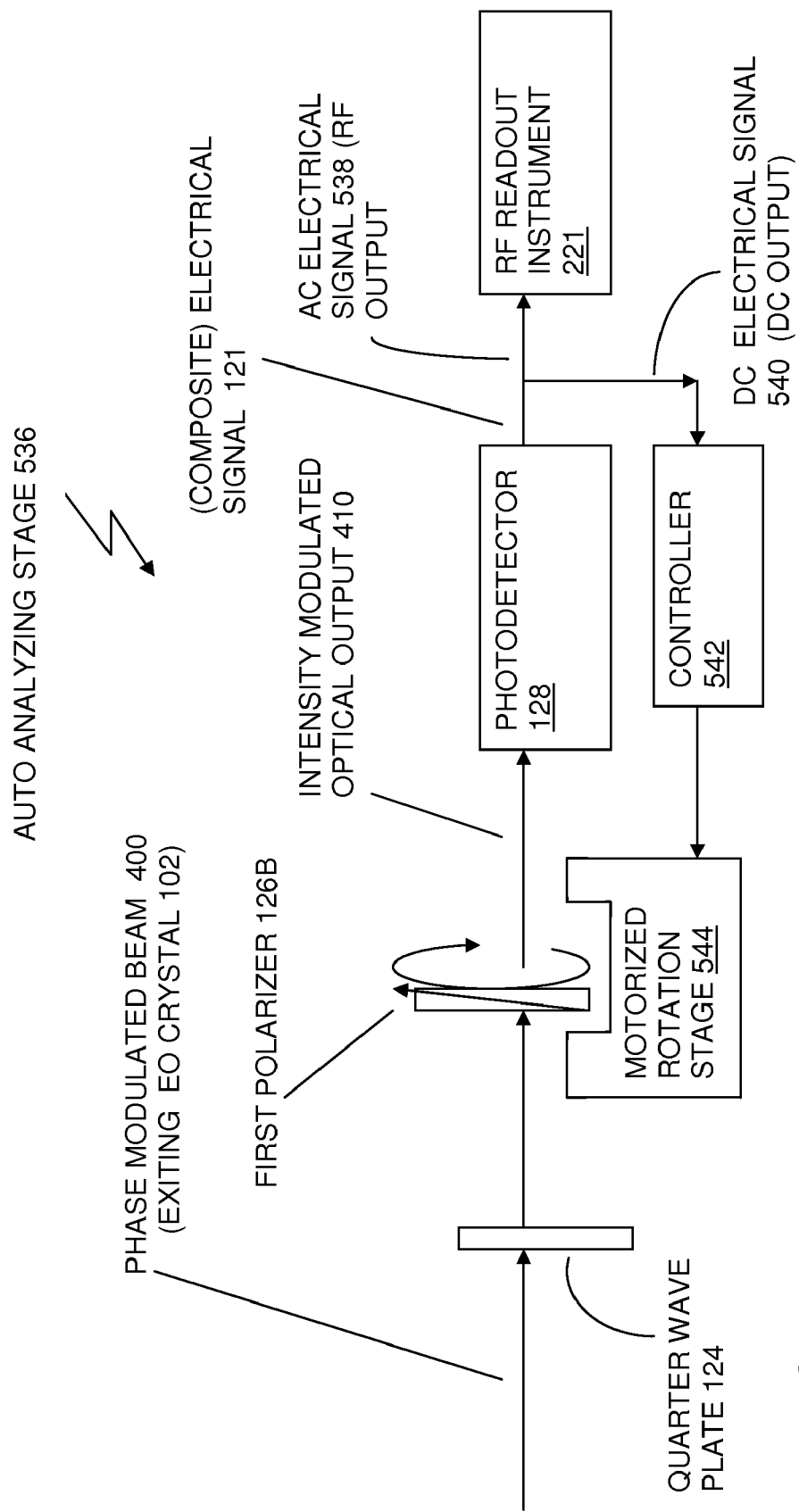
FIG. 5 illustrates a system configuration of an auto analyzing stage of an electro-optic field measuring system.

Referring to FIG. 2, FIG. 4 and FIG. 5, the photodetector 128 converts the modulated beam intensity $\Delta P$ of the phase modulated beam 400 into a modulated voltage signal $\Delta V$, which can be viewed on the oscilloscope 120. Typical high speed (>GHz) photodetectors, such as photodetector 128, have conversion gains of the order 1000 V/W. Thus, the responsivity of the sensor head 101 EO sensor $\alpha$=$\Delta V$/E will be of the order of 1 mV/(kV/m) or 1 $\mu$m.

There are numerous advantages to the current sensor design. A key distinguishing feature of the exemplary embodiments over conventional (D dot) field sensors is that the components of the sensor head 101 and/or sensor head 201 are free of metallic materials, and thus do not perturb the very fields, such as the external electrical field 130, which is being measured. Conventional field sensors interrupt the external electrical field 130, and therefore yield unreliable results. In the exemplary embodiments, unlike conventional sensors, which detect only field strength, the sensor head 101 and/or sensor head 201 detects both field strength and phase. That is, the electrical signal 121 (output) from the sensor will be a precise reproduction of the external electrical field 130 applied to the sensor head 101 and/or sensor head 201. Also, in the exemplary embodiments, the sensor head 101 and/or the sensor head 201 is capable of detecting an external electrical field 130 over an ultra broadband range, namely in the order of from DC to 10 GHz. The bandwidth of conventional field sensors is typically a few percent of their operating frequencies, and therefore the bandwidth of conventional field sensors is much poorer than that of the EO sensors of the exemplary embodiments disclosed herein. In addition to the above mentioned advantages, the sensor head 101 of the exemplary embodiments is much smaller than the conventional B dot and D dot probes, making the sensor described in the exemplary embodiments useful for detailed field detection even in small confined areas. By reflecting the laser probe beam 132 back through the crystal, the sensitivity is doubled (through the added optical path length), without increasing the size of the sensor head 101 and/or the sensor head 201.

The reflection mode design also allows for remote detection of an external electrical field, such as the external electrical field 130. Referring to FIG. 4, the laser probe beam 132 can simply be directed into the external electrical field 130 region, reflected back, and proceeds to extract the field. Thus the signal processing electronics can be located remotely from the external electrical field 130, avoiding any possible exposure to the external electrical field 130 or electrical interference.

Referring to FIG. 2 and FIG. 3, the quarter wave plate 124 integrated into the sensor head 101 produces two additional advantages. First, it improves the sensor responsivity and stability over the traditional (crossed polarizer) configuration by eliminating drifts in the peak responsivity caused by changes in the birefringence of the EO crystal 102. Second, the quarter wave plate 124 integrated into the sensor head 201 allows the sensor to be passively calibrated by monitoring the transmitted power of the laser probe beam 132 (i.e., the photodiode current in the photodetector 128). Therefore, in the exemplary embodiments, the sensor can be set and/or preset to its most sensitive state and prepared for detection, prior to being placed in the external electrical field 130.

Referring to FIG. 2, the purpose behind the developments of the exemplary embodiments is to analyze a phase modulated laser probe beam, such as the laser probe beam 132, from optically modulating devices such as EO modulators and EO field sensors, while stabilizing and maximizing both the amplitude and phase of output optical signals.

FIG. 4 (also see FIG. 10A) illustrates a general optical modulation application of the exemplary embodiments, including the laser 116, a second polarizer 126B, the EO crystal 102, the first polarizer 126A, the photodetector 128 and the oscilloscope 120. In some configurations, such as that illustrated in FIG. 4, the quarter wave plate 124 is not used to analyze (i.e., polarize) the laser probe beam 132. The external electrical field 130 applied to the EO crystal 102 or EO polymers produces a change in the birefringence of material comprising the EO crystal 102 (i.e., exhibiting an electro optic effect). The laser probe beam 132 passing through the EO crystal 102 or EO polymer senses these modulations through changes in the phase, or polarization state of the laser probe beam 132. The laser probe beam 132 then passes through an analyzer (i.e., the first polarizer 126A), whose transmission axis is typically set at a 45 degree angle with respect to the c axis 310 of the EO crystal 102. The analyzer (i.e., first polarizer 126A) converts the laser probe beam 132, which has been phase modulated, to an intensity modulated optical output 410 (typically sent to a photodetector 128 or to another optical circuit).

The amplitude of the optical output signal will be proportional to the amplitude of the external electrical field 130 applied to the EO crystal 102 or EO polymer. The proportionality factor is defined as the EO responsivity. For EO field sensor applications, the optical output signal will be used to determine the strength and phase of an external electrical field, such as the external electrical field 130. In optical modulator applications, the external electrical field 130 applied will be used to drive and control the optical output signal.

In applications such as those that the exemplary embodiments are directed to, it is often a desired goal to maximize the EO responsivity. However, in the configuration shown in FIG. 4 and FIG. 10A, the EO responsivity is proportional to a phase factor, $\sin \phi_0$. In the exemplary embodiments, $\phi_0$ is a quantity which depends on the optical path length of the laser probe beam 132 within the EO crystal 102, the birefringence of the EO crystal 102, and the wavelength of the laser probe beam 132. The phase factor is strongly influenced by very small changes in the optical path length (less than one wavelength of the laser probe beam 132) as well as nonlinear optical effects such as photorefractivity (optically induced birefringence), pyroelectricity (thermally induced birefringence), and photoelasticity (strain induced birefringence). Because of these internal effects, the phase factor can vary uncontrollably between −1 and +1. This is generally an undesirable effect since the EO responsivity becomes an unpredictable quantity. In exemplary embodiments, FIG. 5, illustrates a technique of maintaining the phase factor at a value +1; thus, simultaneously optimizing and stabilizing the EO responsivity.

In accordance with exemplary embodiments, FIG. 5 represents configuration changes of the EO sensor over the configuration of the EO sensor illustrated in FIG. 4. The analyzer (i.e., the second polarizer 126B) coupled to the photodetector 128 in FIG. 4 is replaced in FIG. 5 with the second polarizer 126B that is automatically rotatable by the addition of a motorized rotation stage 544, shown schematically in FIG. 5, as including the following elements: the motorized rotation stage 544, a computer controller, such as a controller 542, communicatively attached to and driving the motorized rotation stage 544, based on the DC component (i.e., DC electrical signal 540) of the electrical signal 121. Referring again to FIG. 5, a wave retardation plate, such as the quarter wave plate 124 is placed between first occurrence of the second polarizer 126B and the analyzer (i.e., the first polarizer 126A), where the first polarizer 126A is communicatively connected to the photodetector 128), and where the fast and slow, i.e., fast/slow axes 312 of the quarter wave plate 124 are set at 45 degree angles with respect to the c axis 310 of the EO crystal 102 (see FIG. 3). With a wave retardation plate, such as the quarter wave plate 124 in this orientation, the phase factor in the responsivity changes from $\sin \phi_0$ to $\cos(\phi_0 + 2\theta_p)$. Here, $\theta_p$ is the rotation angle of the analyzer (i.e., the second polarizer 126B) with respect to the c axis 310 of the EO crystal 102 (see FIG. 3). Since $\theta_p$ has a range of 360 degrees, the phase factor can be adjusted to be +1 for any arbitrary value of $\phi_0$. However, since $\phi_0$ is constantly changing (due to optical instabilities), the analyzer/polarizer angle which produces a phase factor of +1 will likewise vary, based on the optical instabilities.

Referring again to FIG. 5, in exemplary embodiments, the physics of the optical circuit is such that the value of $\theta_p$ which maximizes the phase factor can be inferred from the beam intensity I transmitted through the analyzer (i.e., the first polarizer 126A). This intensity is measured through the dc level of the modulation signal, or through a photodiode current monitor (common in many photodetectors, such as the photodetector 128). As the analyzer (i.e., second polarizer 126B) is rotated, by the motorized rotation stage 544, through its full 360 degree range, I will undergo maximum and minimum values ($I_{max}$, $I_{min}$). The value of $\theta_p$ which produces a phase factor of ±1 will always occur (i.e., for any arbitrary value of $\phi_0$) when the transmitted beam intensity is one half of its maximum plus minimum values i.e., when $I = (I_{max} + I_{min})/2$. A phase factor of +1 generally occurs when the derivative $dI/d\theta_p > 0$, while a phase factor of −1 generally occurs when the derivative $dI/d\theta_p < 0$.

Again referring to FIG. 5, a feedback algorithm is utilized in conjunction with the controller 542 having a memory containing a program unit including a computer readable and computer executable medium where a computer readable and computer executable program code resides. When the program code is executed by the controller 542, the executable program code causes the controller 542 to measure I (from either the photodiode current monitor or a dc signal level of electrical output, such as the DC electrical signal 540) as a function of the rotation angle ($\theta_p$) of the second polarizer 126B, which is communicatively connected to the photodetector 128, as illustrated in FIG. 5. The controller 542 measures I from either an internal voltmeter, or directly from the oscilloscope 120. Based on these measurements, the controller 542 sends a signal, to the motorized rotation stage 544, which rotates the second polarizer 126BA to sustain the targeted level of beam intensity i.e., $(I_{max} + I_{min})/2$, with $dI/d\theta_p > 0$. Changes or drifts in $\phi_0$ are observed as changes in I, which can be automatically corrected by small changes in the analyzer angle, (i.e., small changes in the angle of the second polarizer 126B). Since $I_{max}$ and $I_{min}$ do not change with $\phi_0$, only a single initial measurement of $I_{max}$ and $I_{min}$ is necessary for sustained operation of the auto analyzing stage 536.

In the exemplary embodiments, the EO crystal 102 is birefringent. Therefore, the laser probe beam 132 passing through the EO crystal 102 will acquire a phase shift φ. The phase shift acquired by the laser probe beam 132 determines the polarization state of the laser probe beam 132 (i.e., either linear, circular, or elliptical polarization state). When the external electrical field 130 E (input) is applied to the EO crystal 102, the phase shift is given as $\phi=\phi_0+\phi_{EO}$, where $\phi_0$ is the phase shift of the laser probe beam 132 with external electrical field 130 is absent (, i.e., where the external electrical field 130 is zero due to the natural birefringence of the EO crystal 102), $\phi_{EO}$ is the additional or "modulated" phase shift produced by the external electrical field 130 applied to the sensor head 101. Generally, $\phi_{EO}$ is proportional to the external electrical field 130 applied to the sensor head 101 (this is the linear electro optic effect).

In the exemplary embodiments, the optical circuit shown in FIG. 4 (also see FIG. 10A) is designed to convert the phase modulation ($\phi_{EO}$) to a modulation of beam intensity. Referring to FIG. 5 and FIG. 4 (also see FIG. 10A), after passing through the quarter wave plate 124 (see FIG. 5), and the analyzer (i.e., the second polarizer 126B), the transmitted beam intensity p reaching the photodetector 128 will be of the form p=$p_0$+m, where $p_0$ is the transmitted intensity when the external electrical field 130 applied is zero (i.e., absent the external electrical field 130), and m is the intensity modulation produced by the incident external electrical field applied to the sensor head 101. In the exemplary embodiments, m is proportional to $\sin \phi_{EO}$. However in most EO sensor applications, $\sin \phi_{EO} \sim \phi_{EO}$, i.e., the modulation is expressed as m=αE (since $\phi_{EO}$ is proportional to E). The quantity α is a constant and is defined as the EO responsivity. Thus by measuring the modulated component of the electrical output signal, such as the electrical signal 121 (output), the input field E can be determined.

In exemplary embodiments, a common difficulty in polarimetric detection technique is that α is an unstable quantity, causing drifts in the amplitude of the sensor output signal when the amplitude of the external electrical field 130 input to the sensor head 101 and/or the sensor head 201 is constant. The drifts are actually produced by variations in the polarization state of the laser probe beam 132 exiting the crystal. These variations are caused by changes in ambient temperature, photorefractive effects, screening charges, and other factors. These mechanisms can cause the polarization state to vary dramatically, between elliptical, circular and linear states. This in turn, will cause the value of α to vary in both magnitude and sign. Under laboratory evaluation conditions, the time scale in which noticeable responsivity fluctuations occur is typically several to tens of minutes. Under outdoor field testing conditions, this time scale can reduced substantially to about one second or less.

From a theoretical basis, the sensitivity to the polarization state arises because of the dependence of m on $\phi_0$. This can be seen explicitly by solving for m in the configuration shown in FIG. 4 (also see FIG. 10A). In normalized units, m is solved for by:

$$m = \sin \phi_{EO} [c_1 \cos \phi_0 - c_2 \sin \phi_0] \quad (3)$$

where $$c_1 = -\sin 2(\theta_P - \theta_\lambda) \sin \phi_\lambda$$

$$c_2 = \sin 2\theta_\lambda \cos 2(\theta_P - \theta_\lambda) + \sin 2(\theta_P - \theta_\lambda) \cos \phi_\lambda \cos 2\theta_\lambda, \quad (4)$$

$\phi_\lambda$ is the phase retardation of the quarter wave plate 124, $\theta_\lambda$ is the rotation angle of the quarter wave plate 124, and $\theta_P$ is the rotation angle of the analyzer (i.e., $\theta_P$ is the rotation angle of the second polarizer 126B). The bracketed quantity in Equation (3) is the term which is affected by the polarization drifts, and shall be defined here as the "phase factor" of the responsivity.

Because of the dependence of m on $\phi_0$, the drifts in polarization complicate the operation of the sensor. In most cases, a separate measurement of the phase shift $\phi_0$ would be required to determine the phase factor and correctly measure E, the external electrical field 130. The fluctuations in the phase factor could be stabilized to a certain degree by constantly adjusting, manually, the wave plate angle ($\theta_\lambda$) and the analyzer angle ($\theta_P$) in response to the polarization drifts. However in certain cases, this is impossible. In exemplary embodiments, this is the case where neither the quarter wave plate 124 nor a half wave retardation plate is used in FIG. 1 (i.e., $\phi_\lambda$=0, π, 2π, etc.). In this configuration, when the laser probe beam 132 exiting the EO crystal 102 reaches a linearly polarized state ($\phi_0$=0), the phase factor in Equation (3) will be zero regardless of $\theta_\lambda$ and $\theta_P$. In such a situation, zero modulation will be produced by the EO sensor.

Referring to FIG. 5, in accordance with exemplary embodiments, there is a unique configuration of optical components which allows a phase factor of +1 to be attained for any polarization state of the laser probe beam 132 (exiting). This is the basis of the auto analyzing stage 536, as illustrated in FIG. 5. Furthermore, a separate measurement of the phase shift $\phi_0$ is not needed in this configuration. This configuration consists of a quarter wave retardation plate, such as the quarter wave plate 124 ($\phi_\lambda$=π/2 in FIG. 3) (also see FIG. 1 and FIG. 5) held at a fixed angle ($\theta_\lambda$) of 45 degrees with respect to the c axis 310 of the EO crystal 102 (see FIG. 3). In this unique configuration, the equations for m and $p_0$ simplify to:

$$m = \sin \phi_{EO} [\cos(2\theta_P + \phi_0)], \quad (5)$$

$$p_0 = \frac{1}{2}[1 + \sin(2\theta_P + \phi_0)].$$

It can be seen in Equation (5) that a phase factor of 1 can be attained for any coherent polarization state (i.e., any value of $\theta_0$) by simply rotating the analyzer (i.e., by simply rotating the first 126A) such that $\cos(2\theta_P+\phi_0)$=1. When this condition is achieved, then $p_0$=½. Therefore, the transmitted power is at one half of the total intensity. Thus, by only monitoring the dc level signal emitted from the photodetector 128, i.e., the DC electrical signal 540 (DC Output), (e.g., via a photodiode current monitor), the sensor, i.e., the auto analyzing stage 536, can be set and maintained at its most sensitive operating point (phase factor=1). The auto analyzer as configured in the auto analyzing stage 536, as illustrated in FIG. 5, performs this very task.

Referring again to FIG. 5, the photodetector 128 converts the transmitted beam intensity into an electrical signal, such as the electrical signal 121. The electrical signal 121 can consist of a dc or zero field component, and a field modulated ac component (i.e., the DC electrical signal 540 (DC Output) and the AC electrical signal 538 (RF Output), respectively). The dc component, i.e., the DC electrical signal 540 (DC Output) level, is essentially a measure of the beam power, $p_0$. This dc component (i.e., the DC electrical signal 540 (DC Output)) is read and monitored by a voltmeter. The voltmeter is read by a computer processor residing in a controller 542, and which instructs the controller 542 to rotate the analyzer (i.e., the first to rotate the second polarizer 126B) based on these readings (also see FIG. 8A and FIG. 10A).

Referring to FIG. 5, when initiated, the auto analyzer (i.e., the second polarizer 126B, now automated) undergoes a full 360 degree rotation, to find the maximum and minimum values of $p_0$, denoted as $p_{MAX}$ and $p_{MIN}$ respectively. For a coherently polarized laser beam of light, such as the laser probe beam 132, Equation (5) predicts that $p_{MAX}=p_0$ and $p_{MIN}=0$. However in real crystals, these measurements can be affected by incoherently polarized light within the laser probe beam 132 (observed as a constant dc background or dc signal level in the photodetector 128). To account for such offsets, the targeted value of $p_0$ for optimal sensor operation is set at $(p_{MAX}+p_{MIN})/2$. According to exemplary embodiments, the operation set point must satisfy $(dp_0/d\theta_p)>0$. The latter condition $(dp_0/d\theta_p>0)$ is necessary to ensure a phase factor of +1, rather than −1 is attained. According to the exemplary embodiments, the Auto Analyzer (i.e., the second polarizer 126B) is then programmed to find and maintain this transmission set point. As the polarization state of the laser probe beam 132 drifts, a change in the transmitted power $p_0$ will be detected, and the Auto Analyzer (i.e., the second polarizer 126B) is instructed to rotate and adjust itself, by-way-of the motorized rotation stage 544, until the targeted transmitted point is again achieved.

Referring to FIG. 4 and FIG. 5, according to the exemplary embodiments, there are several advantages of the exemplary embodiments over conventional and/or traditional polarizers. First, the configurations and operations of the exemplary embodiments simultaneously stabilize and maximize the amplitude of intensity modulated light signals, such as intensity modulated optical output 410 (see FIG. 4 and FIG. 5), from EO modulating devices. The use of conventional and/or traditional polarizers can improve the stability to a certain degree, but cannot overcome signal amplitude losses due to changes in the phase factor of the EO responsivity.

Second, the second polarizer 126B, automated, in the exemplary embodiments allows for hands free operation of the modulating device. That is, the second polarizer 126B automated in the exemplary embodiments eliminates the cumbersome task of constant manual adjustment of the analyzer (i.e., eliminates the cumbersome task of constant manual adjustment of the second polarizer 126B) to seek the optimal response.

Third, the optimal analyzer (i.e., the second polarizer 126B (optimal)) position is achieved passively, by monitoring the transmitted beam intensity. This feature is particularly useful in EO field sensing applications, since the sensor can be placed in its "ready" state prior to the application of the external electrical field 130.

Figure 6:
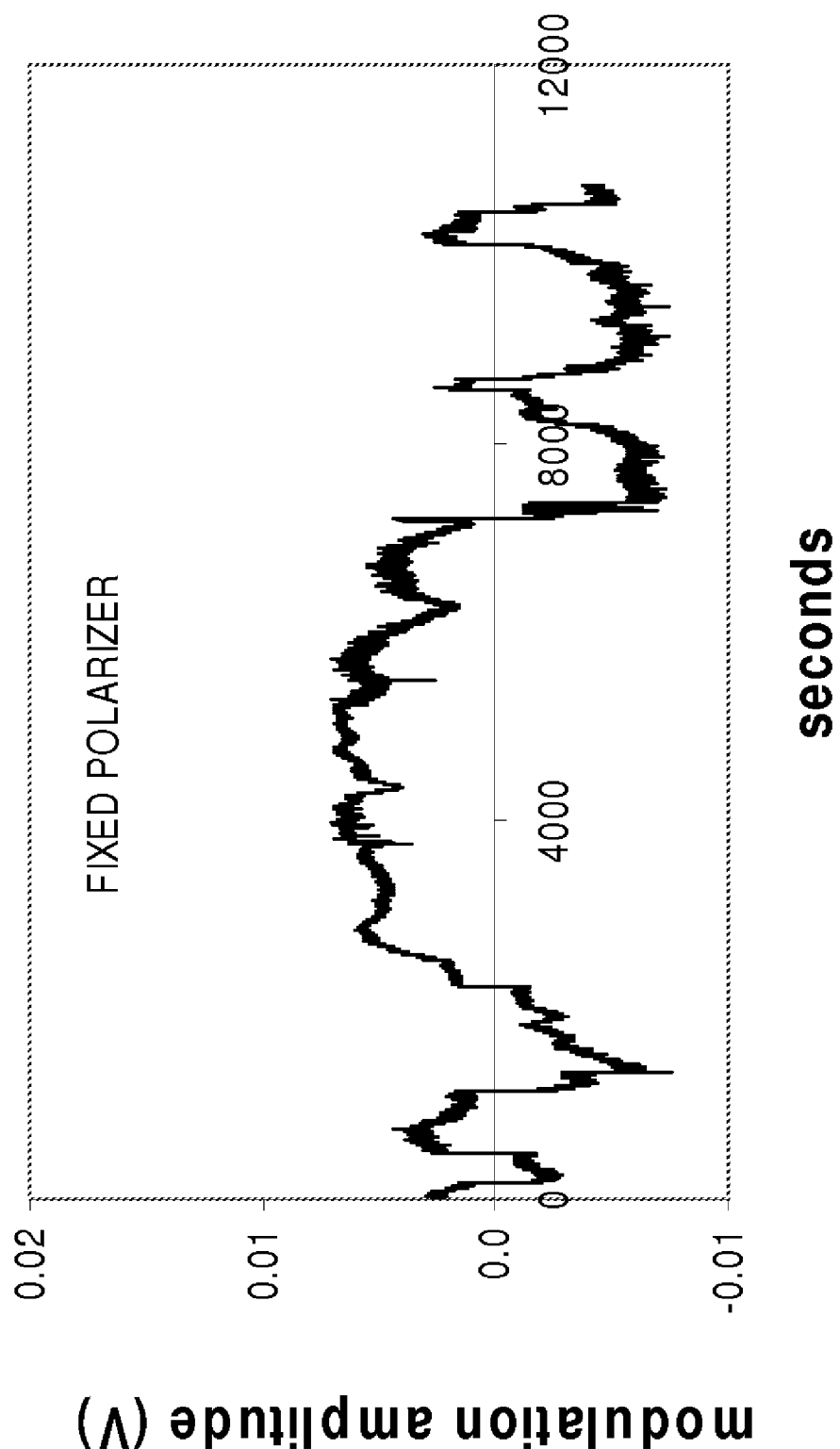
FIG. 6 illustrates an unstable electro-optic modulation signal, plotted as a function of time, from electro optic field sensors, using a fixed polarizer without using an auto analyzer.
Figure 7:
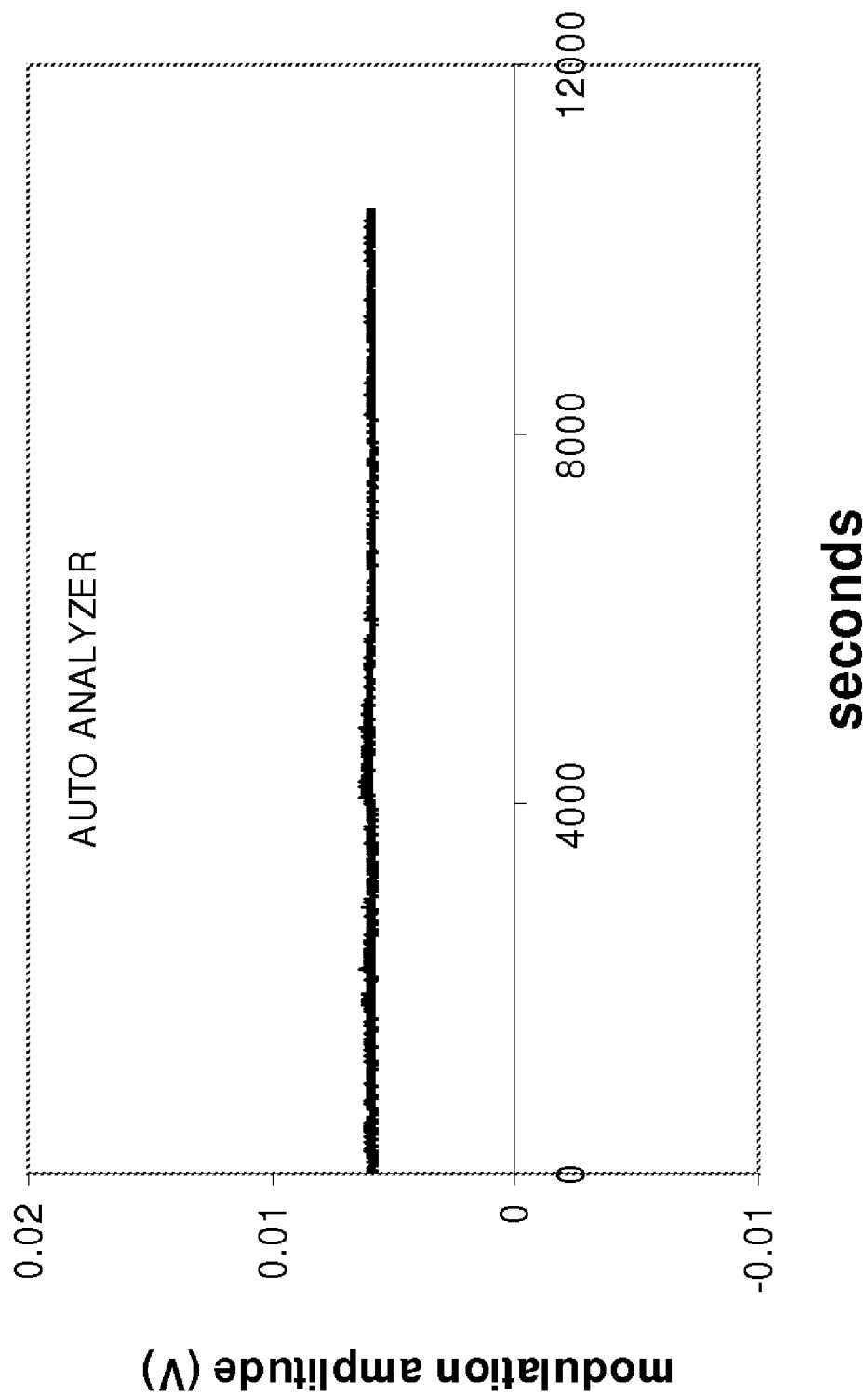
FIG. 7 illustrates a stable electro-optic modulation signal, plotted as a function of time, from electro optic field sensors, using an auto analyzer in place of the fixed polarizer.

FIG. 6 and FIG. 7 illustrate the stability and maximization of modulation amplitude (V) of intensity modulated light signals, such as intensity modulated optical output 410 (also, see FIG. 4 and FIG. 5), from EO modulating devices. FIG. 6 and FIG. 7 compare the modulation pulse height from EO field sensors plotted as a function of time. In FIG. 6, a traditional polarizer, such as the second polarizer 126B, (set at a fixed angle) was used in the analyzing stage, such as the analyzing stage 136. In FIG. 7, an auto analyzer, i.e., the second polarizer 126B automated in auto analyzing stage 536 (see FIG. 5) was used to analyze the laser probe beam 132. As demonstrated by a comparison of FIG. 6 and FIG. 7, constantly adjusting conventional and/or traditional polarizers can improve the stability of the signal, but cannot overcome signal amplitude losses due to changes in the phase factor of the EO responsivity.

Figure 10A:
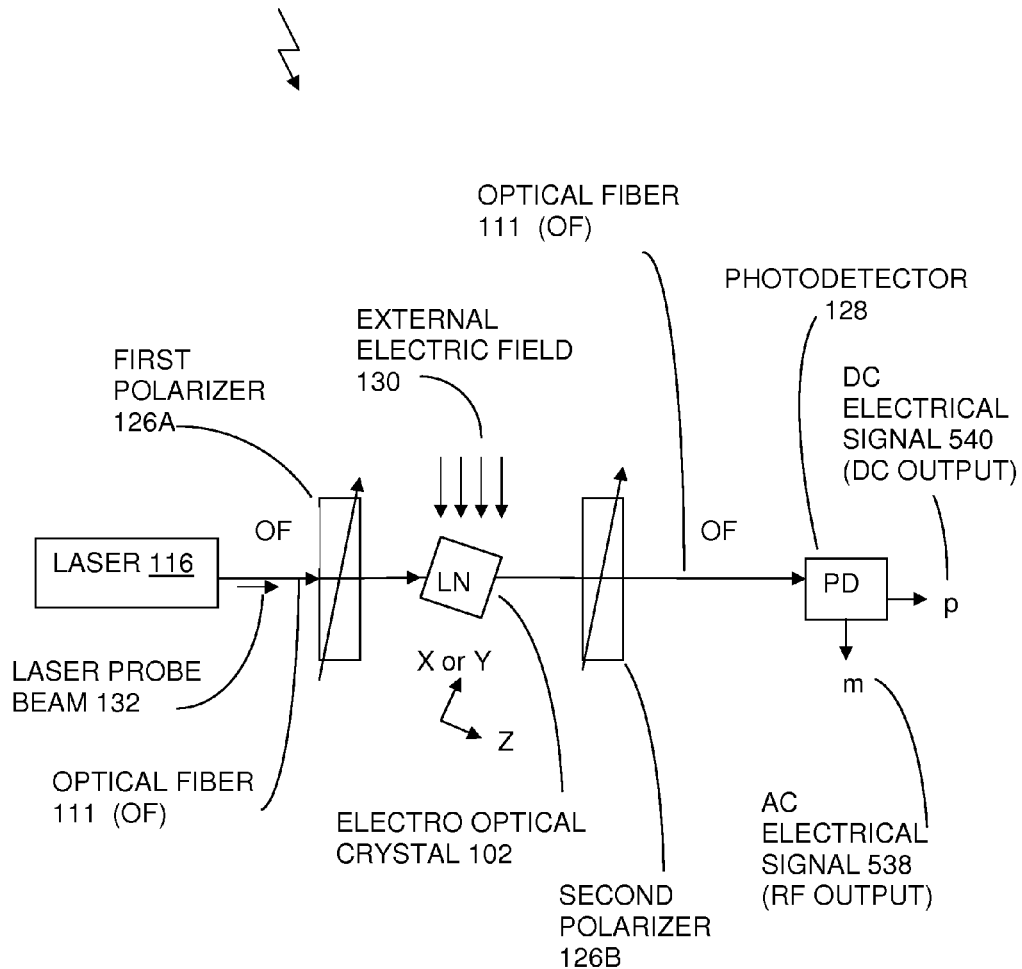
FIG. 10A illustrates the quasi-longitudinal-mode sensor with a slightly tilted EO crystal component.

Referring to FIG. 10A, the exemplary embodiments of the instant application herein disclose a quasi-longitudinal-mode EO sensor employing an electro-optic crystal (for example, $LiNbO_3$ and KD*P). Through experimentation, it was determined that the KD*P (potassium dideuterium phosphate) also known as ("$KD_2PO_4$") sensor had the higher sensitivity. Most of the experiments and demonstrations, however, were performed with $LiNbO_3$; hence the modified invention based on $LiNbO_3$ is described. However, the same technique can be used with KD*P or other EO materials including: Lithium Tantalate ($LiTaO_3$); or Potassium titanium Oxide Phosphate ($KTiOPO_4$) also known as ("KTP"); or Strontium Barium Niobate ($Sr_{0.25}Ba_{0.75}Nb_2O_6$) also known as ("SBN-75"); or Strontium Barium Niobate ($Sr_{0.4}Ba_{0.6}Nb_2O_6$) also known as ("SBN-60"); or Barium Strontium Titanate Niobate ($Ba_{1-x}Sr_xTi_yNb_{2y}O_6$) also known as ("BSTN"); or BSKNN-2 ($Ba_{0.5}Sr_{1.5}K_{0.5}Na_{0.5}Nb_5O_{15}$); or DAST; or Zinc Telluride (ZnTe). Thus, the new sensor head a unique configuration designed to address the noise and stability issues that are inherent in conventional EO field sensors for HPM applications.

The automated method of stabilizing the transverse EO sensor in the exemplary embodiment work well in laboratory applications, where shorter lengths (e.g., several meters) of optical fibers are typically used. However, high power microwave applications require fiber lengths of 50 meters or longer, which presence instability problems beyond the capability of the automated analyzer used in the transverse EO sensor in the exemplary embodiment. In the transverse EO sensor in the exemplary embodiment, the EO crystal exhibits static birefringence, causing the probe beam 132 to acquire a zero field phase shift ($\phi_0$). Along with the EO coefficient, m also depends on a phase factor $\theta(\Phi)$ that varies sinusoidally with $\phi_0$. Problems arise when very small drifts occur in the static birefringence, induced by ambient temperature changes, strain, photorefractivity. Because the optical pathlength of the crystal (several mm) is much larger than the wavelength of the laser (1550 nm), birefringent drifts as little as $10^{-4}$ can alter the value of $\phi_0$ by several radians and compromise the sensor responsivity and calibration. These phase drifts can be compensated to stabilize the sensor responsivity using an automated compensation technique, such as in the automated analyzer used in the exemplary embodiment. To incorporate such a technique into the fiber attached EO sensor, a polarization maintaining (PM) fiber must be used to carry the optical signal from the crystal to the compensation optics located remotely at the end of the fiber. However, PM fiber is highly birefringent. Thus it adds an additional phase shift, and consequently, phase noise to the optical signal. Static or slowly drifting values of the acquired phase can be dealt with through the automated analyzer in the exemplary embodiment, but cannot be used to control faster fluctuations. Consequently, they are converted to amplitude noise by the analyzer (second polarizer 126B). The origin of the higher frequency phase noise is likely to be the spectral bandwidth of the laser. Small wavelength fluctuations in the laser output are directly converted to phase noise in the PM fiber. Based on the length and birefringence of the PM fiber, as well as the responsivity of the EO crystal, it is estimated the noise amplitudes were generated by wavelength fluctuations of about 0.012 nm (1.5 GHz). Because phase noise cannot be easily remedied through stabilization or noise cancellation techniques, the probe beam 132 is passed along a crystal direction of low birefringence (i.e., a nearly circular optical indicatrix) rather than one of high EO modulation. The EO crystal is oriented such that a small tilt angle Theta ($\propto$) (~1°) is subtended between its optic axis and the path of the probe beam.

This is done in order to produce a small, but stable zero field phase shift $\phi_0(\theta)$ within the probe beam. The birefringence is given by $n_e(\theta)-n_o$, where:

$$n_e(\theta) = \frac{n_e n_o}{\sqrt{n_e^2\cos^2\theta + n_o^2\sin^2\theta}}, \quad (6)$$

and $n_e$ and $n_o$ are extraordinary and ordinary refractive indices respectively. The phase shift, $\phi_0(\theta)=2\pi L(n_e(\theta)-n_O)/\lambda$ is much less sensitive to refractive index variations than the corresponding quantity $\phi_0=2\pi L(n_e-n_O)/\lambda$ in the original transverse EO sensor. This is evident from the relationship $d\phi_0(\theta)/du \; \theta^2 d\phi_0/du$, where u is any physical quantity in which the refractive indices can vary (temperature, strain, light intensity, etc). For $\theta=1°$ (17.4 mrad), this indicates an improvement in phase stability of over three orders of magnitude. With such stability, the compensation optics used with the original EO sensor are no longer needed and the analyzer P2 (second polarizer 126B) can be mounted in a fixed position within the sensor head, i.e., prior to the output fiber. The transmission axis of P2 (second polarizer 126B) is oriented at a 90° angle with respect to that of the input polarizer P1 first polarizer 126A. The phase factor, given by $f(\Phi)=\sin\phi_0(\theta)$, is typically set to a relatively low value of ~0.3 to limit the dc optical power transmitted through the analyzer to $\leq 1$ mW. This is done to avoid photocurrent saturation as well as to limit Johnson and shot noise. In implementing this design with $LiNbO_3$, an EO phase modulation is induced between the probe beam polarization components along the x and y crystal axes when an electric field is applied along the y axis. The activated EO coefficient, $r_{22}$ (=7 pm/V) is 4.3 times smaller than the corresponding value $r_{33}$ in the original EO sensor. Despite the weaker modulating power, the overall sensitivity is dramatically improved. The sensitivity improvement is due to the integration of the analyzer (such as the second polarizer 126B) into the sensorhead, positioned close to the EO Crystal 102, which virtually eliminates the phase noise. Also, the amplitude of the EO modulation signal (compared to the original EO sensor) is nearly unchanged despite its smaller EO coefficient. The reason for this is the optical coupling between the input and output fibers was increased by a factor of 4, nearly canceling the effects of the smaller value of $r_{22}$. The improved optical coupling is achieved by using a larger core multimode (MM) fiber in place of the PM output fiber, to reduce insertion losses. Further improvements can be made by replacing the $LiNbO_3$ crystal with potassium dideuterium phosphate (KD*P). When implementing the modified sensor design with KD*P, sensitivity is increased by an additional factor of 3.5 due to its larger EO coefficient along the optic axis $r_{63}$ (=25 pm/V).

Figure 8A:
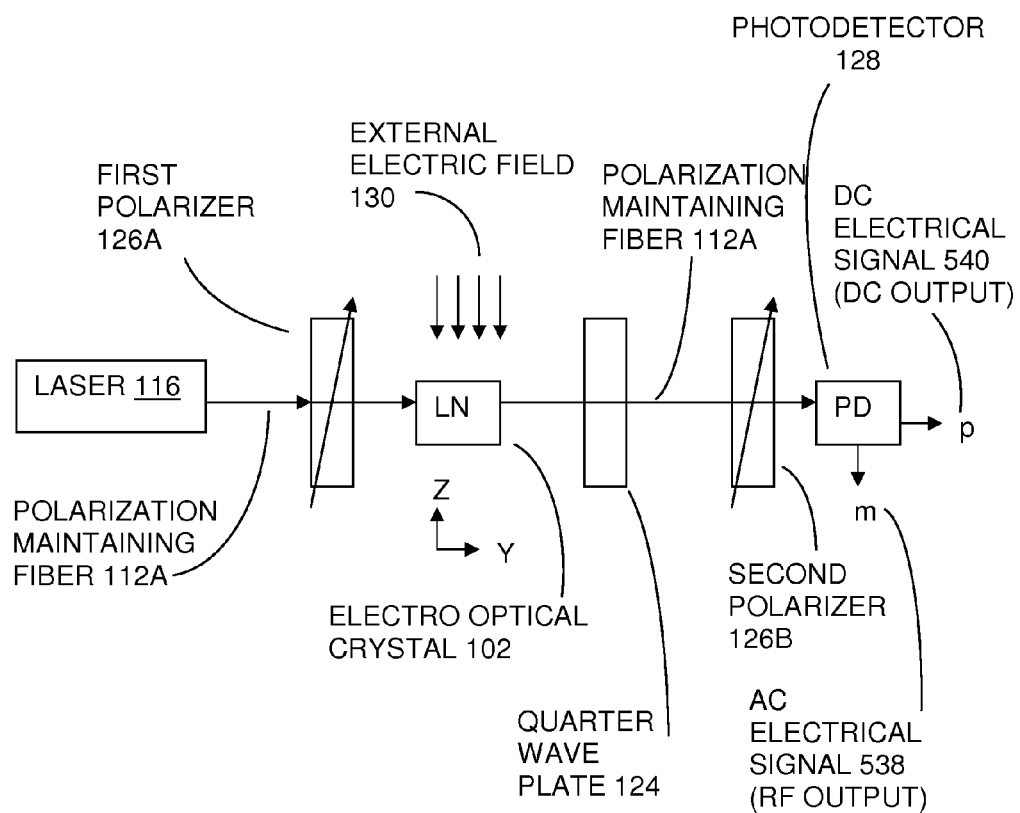
FIG. 8A illustrates an electro-optic field sensing apparatus for measuring an applied electrical field using a sensor head and optical fiber for transmitting a laser probe beam communicatively from the laser to the sensor-head and then from the sensor-head to the photodiode (PD).

Referring to FIG. 8A and FIG. 1, in order to better describe and/or understand the preferred exemplary embodiments and their merits, it will be worthwhile to review the above previously described EO field sensor 100 (see FIG. 1) in terms of its limitations and shortcomings in HPM field tests. A schematic diagram of the previous, transverse EO field sensor is illustrated in FIG. 8A (also see FIG. 1). A lithium niobate ($LiNbO_3$) crystal is placed in an external electric field E (hereafter "the external electric field 130"), which typically has a radio or microwave frequency. Again referring to FIG. 8A, the optic axis (z-axis) of the crystal is aligned to the direction of the field. A laser probe beam 132 (see FIG. 2) is sent to the electro optic crystal 102 through an input polarization-maintaining (PM) optical fiber (herein "the polarization maintaining fiber 112A"), with a propagation direction along the y-axis of the crystal (see FIG. 8A), and a polarization angle (set by polarizer P1, herein "the first polarizer 126A") of 45 degrees with respect to the z-axis of the crystal (see FIG. 8A). The 45-degree polarization vector of the beam can be resolved into two components of equal magnitude: one along the crystalline z-axis and the other along the crystalline x-axis or y-axis. Because of the birefringence and electro-optic properties of the crystal, there will be a phase delay $\phi_c$ occurring between the two polarization components, as they propagate along the y-axis of the crystal. When the beam exits the crystal, it will be, in general, elliptically polarized. The beam is then launched into an output PM fiber. Because PM fiber is highly birefringent, the beam will undergo additional phase delays within the output fiber polarization maintaining fiber 112A. Again referring to FIG. 8A, the beam eventually reaches a quarter-wave retardation plate (QWP) quarter wave plate 124 and a second polarizer (P2) (herein "the second polarizer 126B"). A fraction of the total beam power will be transmitted through the second polarizer 126B and be received by a photodiode detector (PD) (herein referred to as the "photodetector 128"), which converts the transmitted power into an electrical output signal that can be monitored by an oscilloscope or spectrum analyzer. The amount of light reaching the photodetector 128 will depend on the rotation angle of the second polarizer 126B, as well as the phase delays within the electro optical crystal 102, the polarization maintaining fiber 112A and quarter wave plate 124.

When the external electric field 130 is applied to the electro optical crystal 102, the electro-optic effect in the electro optical crystal 102 modulates the value of $\phi_c$, and therefore modulates the beam intensity reaching the photodetector 128. The phase delay ($\phi_c$) within the electro optical crystal 102 actually consists of two terms: a zero-field phase delay $\phi_0$ which is due to the natural birefringence of the crystal, and an EO phase delay $\phi_{EO}$ that is proportional to the external electric field 130. For typical electric fields used in HPM experiments, $\phi_{EO}$ will generally be less than 0.01 radians. Since $\phi_0$ is typically of the order $10^3$ radians, $\phi_0 \gg \phi_{EO}$. Because of this, $\phi_{EO}$ is better described as a "phase modulation" rather than a phase delay. As the electric field oscillates (at a microwave or RF frequency), the phase of the beam also oscillates with the same frequency, as does the transmitted beam power through the second polarizer 126B. The modulation of the beam power is proportional to $\phi_{EO}$; and therefore the modulation of the beam power is proportional to the electric field strength of the external electric field 130 along the optic axis. Thus, by measuring the transmitted beam power through the second polarizer 126B, the vector component of the external electric field 130 can be determined.

Figure 8B:
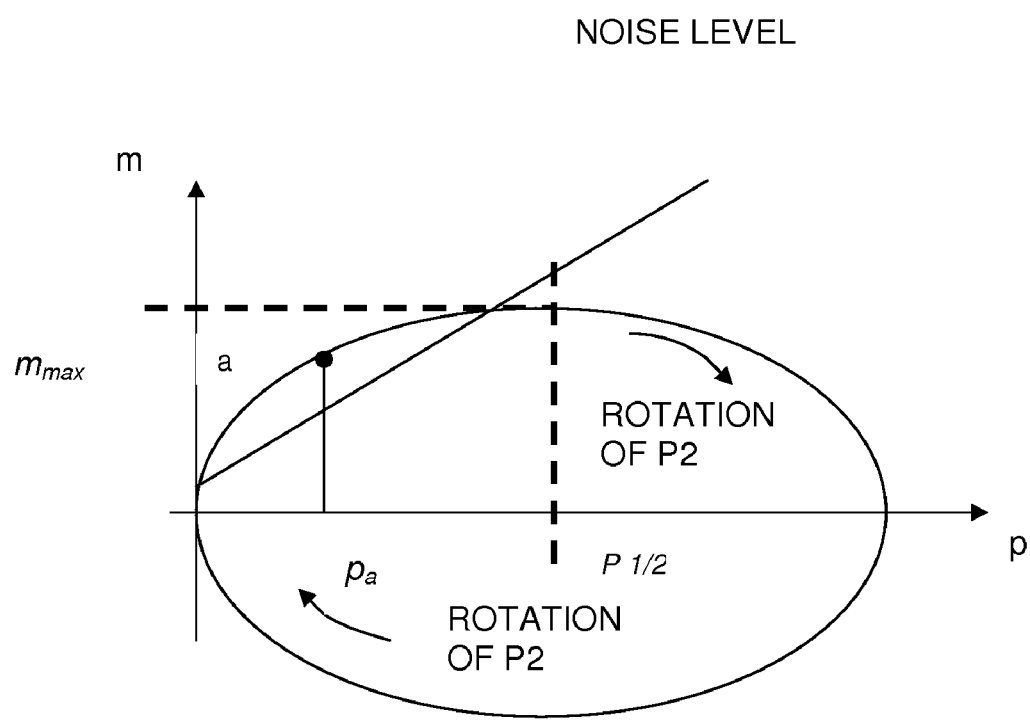
FIG. 8B illustrates the functional relationship between m (modulation depth) and p (the probe beam power transmitted through the second polarizer) (as P2 is rotated).

Referring again to FIG. 8A, typical photodiode detectors have two electrical outputs: the first electrical output is a dc output, p (herein referred to as "the DC Electrical Signal 540 (DC Output)"), which measures the total, time-averaged transmitted-beam power, and the second electrical output is an RF output m (herein referred to as "the AC Electrical Signal 538 (RF output)"), which measures the ac or modulated component of the signal. It can be shown that the amplitude of the modulated signal m will be at its maximum value $m_{max}$, when the transmission axis of second polarizer 126B is rotated such that p is at its half-transmittance point, $p_{1/2}$. The functional relationship between m and p (as second polarizer 126B is rotated) is illustrated in FIG. 8B.

The sensor configuration shown in FIG. 8A utilizes the maximum modulating power of the electro optic crystal 102 (also referred to as the $LiNbO_3$ crystal), since its largest electro-optic coefficient ($r_{33}$) is used when the electric field is applied along the optic axis (c- or z-axis of the $LiNbO_3$ crystal). Additionally, when the axes of the QWP, i.e., the quarter wave plate 124 and the optical fiber are correctly oriented, the value of $m_{max}$ will be optimized. This means that $m_{max}$ will not depend on any phase delays within the optical circuit; $m_{max}$ will depend only on the intrinsic properties of the crystal and probe beam (also see FIG. 8B).

Figures 9A, 9B:
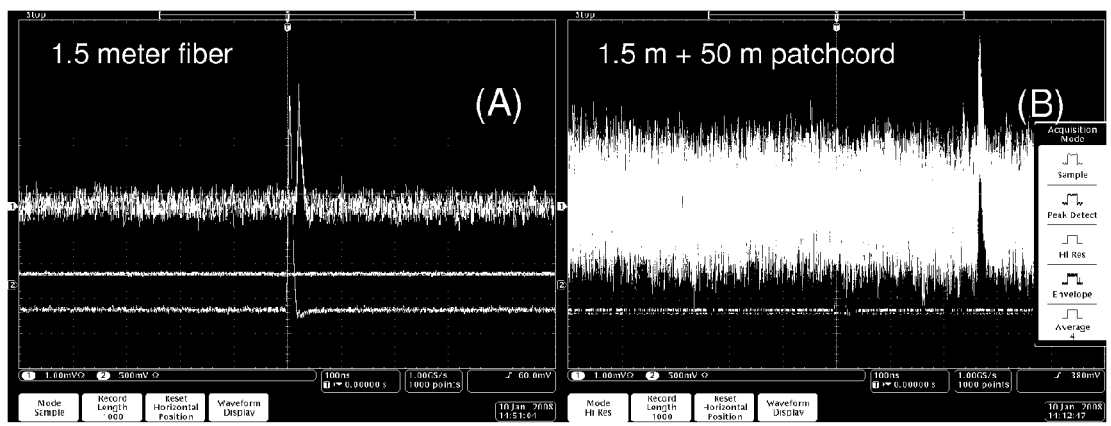
FIG. 9A illustrates an actual example of optical noise, with a modulation signal (top trace) from an EO sensor with a 1.5 m fiber-cable length.
FIG. 9B illustrates another actual example of the optical noise, where

Referring to FIG. 8A, FIG. 1, FIG. 2, FIG. 4, and FIG. 5, in spite of this optimized design, two major problems remain in configuring this sensor for use in microwave field tests. In these tests the readout instrumentation (such as the photodetector 128, the RF Readout Instrument 221 (see FIG. 2), where the RF Readout Instrument 221 can be any one or more of an oscilloscope, such as the oscilloscope 120 illustrated in FIG. 1, a Digital Multi-Meter, a Specialized Network Analyzer, a Power Analyzer, a Vector Analyzer and/or a spectrum analyzer or any other readout instrument) must be isolated and protected from the HPM source, in order to avoid electrical interference with, or damage to, the above listed instrumentation. Obviously, sufficient isolation can be achieved by keeping the instrumentation as far away as possible from the HPM field. To do this, however, one has to use very long optical fibers. However, when the fiber-optic cable length is tens of meters long, tremendous optical noise is introduced, which compromises the sensitivity of the EO sensor, such as the EO sensor 100 and/or EO sensor 200. Because this noise contains a large polarization-dependent component (such as, phase noise within the output fiber), simple noise cancellation techniques, such as balanced detection, cannot be used effectively. The noise level generally increases with fiber length. An actual sample of the optical noise is illustrated in FIG. 9A and FIG. 9B. FIG. 9A illustrates a modulation signal (top trace) from an EO sensor, such as EO sensor 100 and/or EO sensor 200 with a 1.5 m fiber-cable length. FIG. 9B shows the same modulation signal, but with a cable that is 51.5 m long. The optical noise level also grows proportionally with p (transmitted beam power through the second polarizer 126B, (see FIG. 8A)), as indicated in FIG. 8B. Because of this proportional relationship, the optimal biasing for long fibers is no longer at $p_{1/2}$ (where m is maximized) but at a position $p_a$ (indicated in FIG. 8B), where the signal-to-noise ratio is maximized.

Again referring to FIG. 8A, in addition to the optical noise problem, stability issues also arise. As stated above, in order to maximize the sensitivity of the sensor, the second polarizer 126B must be rotated until the desired operating point ($p_a$ or $p_{1/2}$) is reached. The polarizer angle that achieves this condition will depend generally on the phase delays within the LiNbO$_3$ crystal, such as the electro optic crystal 102, the quarter wave plate 124 and output PM fiber, such as polarization maintaining fiber 112A. The birefringent phase delay $\phi_0$ in the LiNbO$_3$ crystal, such as the electro optic crystal 102, will in general drift over time, due to ambient temperature changes, photorefractive effects, and other mechanisms that produce changes in the refractive index. Under typical experimental parameters, an index change within the crystal as small as $10^{-4}$ can cause the rotation angle to shift by 45 degrees in the target second polarizer 126B (P2). Changes in the refractive index and changes in phase delay can also occur in the output of the optical fiber, due to temperature changes and strain, produced by vibrations and other movements of the fiber. In indoor laboratory settings, these phase drifts in the LiNbO$_3$ crystal and PM fiber, such as the second polarizer 126B, usually occur in a slow, controlled manner and can be compensated for by corrections in the rotation angle of the second polarizer 126B (P2). In such situations, the target transmittance point ($p_a$ or $p_{1/2}$) can be stably sustained, and the sensor (such as the EO sensor 100 or the EO sensor 200) can be stably operated at its peak sensitivity. In outdoor field settings, however, which are subjected to considerable temperature and humidity variations, along with the influence of wind and other factors, these fluctuations can be more abrupt and violent. The temperature variation is often extreme due to the ground planes of the HPM test site, which absorb heat from the sun. This can prevent the EO sensor (such as the EO sensor 100 or the EO sensor 200) from operating stably at its peak sensitivity, thereby affecting its accuracy and reliability.

Figure 10B:
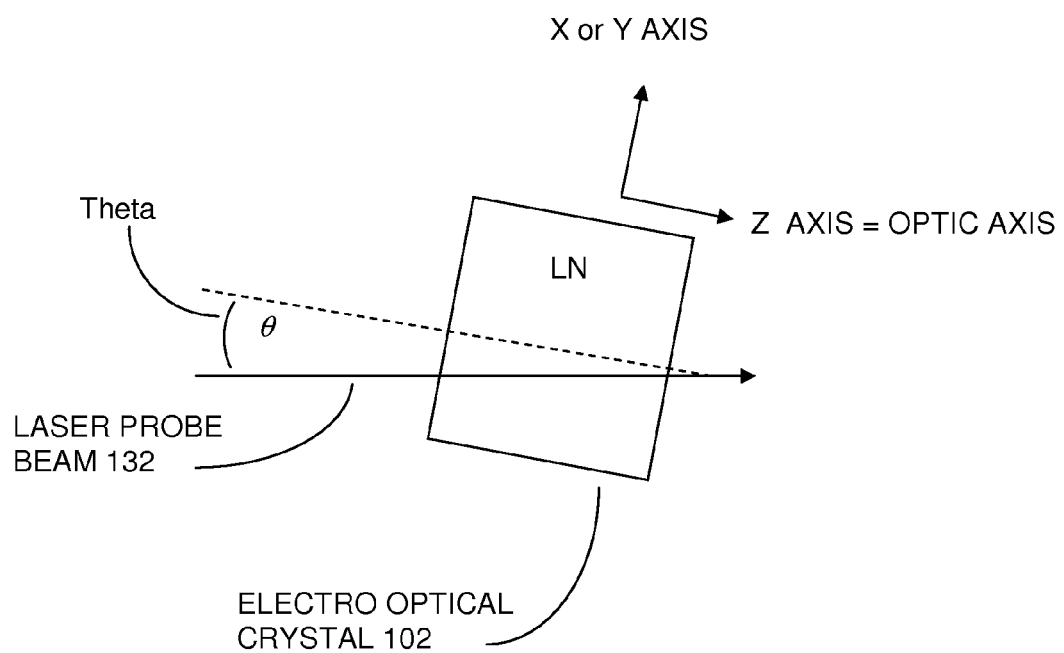
FIG. 10B illustrates the EO crystal component tilted slightly about the z-axis, such that the propagation direction of the laser probe beam makes a small angle $\theta$ with respect to the optic axis (z-axis) of the EO crystal.

Referring to FIG. 10A, and FIG. 10B, the first exemplary embodiment, addresses the critical noise and stability problems by modifying the sensor design, as shown in FIG. 10A. The preferred exemplary embodiments are best described as quasi-longitudinal-mode EO sensors based on lithium niobate (LN). FIG. 10A illustrates the first exemplary embodiment of a quasi-longitudinal-mode EO sensor 1000OF. In contrast to the transverse configuration, such as EO sensor 100 and/or EO sensor 200 (see FIG. 1, FIG. 2, FIG. 4, and FIG. 8A), the LiNbO$_3$ crystal, such as the EO crystal 102 is oriented such that the y-axis of the crystal is aligned with the direction of the external electric field 130. The laser probe beam 132 is sent to the EO crystal 102 through the polarization maintaining fiber 112A. Referring again to FIG. 10A, in the first exemplary embodiment, the EO crystal 102 is tilted slightly about the z-axis (also, see FIG. 10B), such that the propagation direction of the laser probe beam 132 makes a small angle Theta ($\theta$) with respect to the optic axis (z-axis) of the EO crystal 102, as illustrated in FIG. 10B. The purpose of this tilt in the EO crystal 102 is to induce a small but stable phase delay in the EO crystal 102, which will be discussed below. The tilt angle Theta ($\theta$) can range from about zero degrees (0°) up to about ten degrees (10°). Typically, the quasi-longitudinal-mode EO Sensor operates with a tilt angle theta ($\theta$) of the EO crystal 102 of less than about one degree (1°) up to about three degrees (3°); however, the quasi-longitudinal-mode EO Sensor operates with the same output result within the tilt range from about (0°) up to about (10°).

Referring to FIG. 10A, in the first exemplary embodiment, the incident polarization angle (set by polarizer P1, such as the first polarizer 126A) is at a 45° angle with respect to the appropriate EO modulation axes of the EO crystal 102. The second polarizer 126B (P2) is integrated into the head of the sensor (see sensor head 101 illustrated in FIG. 1 and/or sensor head 201, illustrated in FIG. 2) behind the crystal, with no intervening quarter wave plate 124 (thus, tilting the EO crystal 102 eliminates the requirement of having an intervening quarter wave plate 124. And the first polarizer 126A and the second polarizer 126B are disposed close to the EO crystal 102 at a distance of about zero (0) millimeters to about ten (10) millimeters (mm). The transmission axis of the second polarizer 126B (P2) is fixed at a 90° angle with respect to transmission axis of first polarizer 126A (P1) (forming a "crossed-polarizer" configuration). Since the second polarizer 126B (P2) is placed inside the sensorhead, the laser probe beam 132 is intensity modulated prior to reaching the output fiber (such as polarization maintaining fiber 112A or multimode fiber 1012) or any other optical fiber (see FIG. 10A and FIG. 10D).

Referring again to FIG. 10A, and according to the first exemplary embodiment, an EO phase modulation, $\phi_{EO}$, is induced between polarization components along the x and/or y crystalline axes. The quantity $\phi_{EO}$ depends on the applied electric field along the y-axis, making the sensor direction-sensitive. The quantity $\phi_{EO}$ in the present case depends on the EO coefficient $r_{22}$, which (in Lithium Niobate) is about four times smaller than the corresponding value $r_{33}$ in the conventional (transverse) design. Although the modulating power of the crystal is weaker in this orientation, there are numerous advantages that improve the stability, reliability and noise characteristics of the quasi-longitudinal-mode EO sensor 1000OF.

Figure 10C:
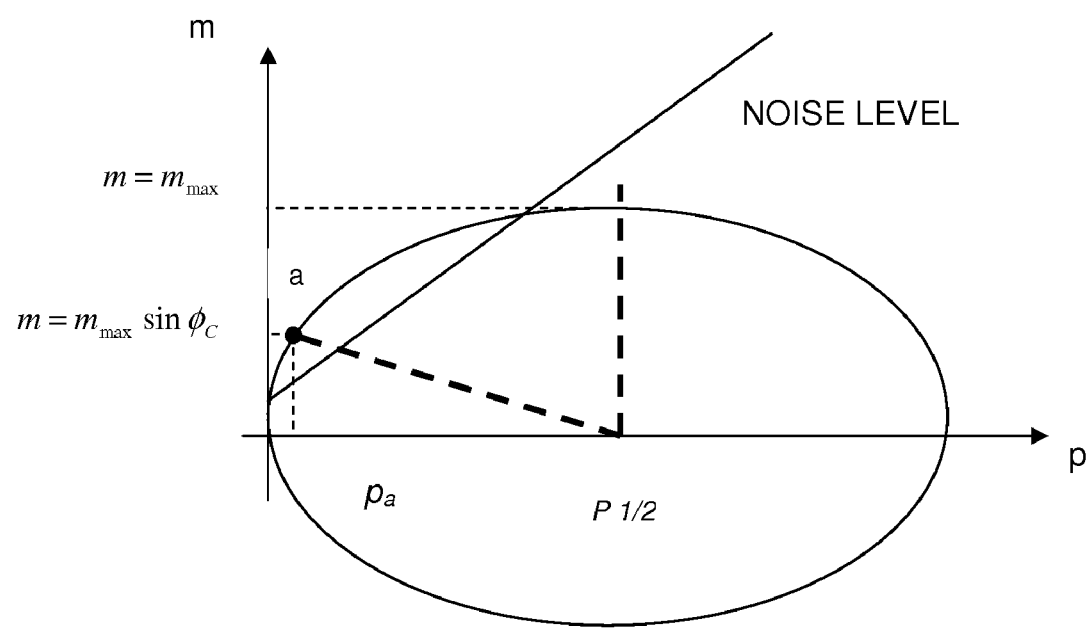
FIG. 10C illustrates the functional relationship between m (modulation depth) and p (the probe beam power transmitted through the second polarizer) in the crossed polarizer configuration.

The functional relationship between m and p in the crossed polarizer configuration is illustrated in FIG. 10C. In a similar manner to the sensor of FIG. 8A, an elliptical relationship occurs. However, the elliptical path is traced out by variations in $\phi_c$ rather than variations in the rotation angle of the second polarizer 126B (P2). Here $\phi_c$ is the total phase delay between polarization components along the x and/or y crystal axes. The modulation m is proportional to sin $\phi_c$. Because of this, the reason for the tilt angle θ becomes apparent. If the laser probe beam 132 propagates precisely along the optic axis (θ=0), no natural birefringence occurs and $\phi_c=\phi_{EO}$. Because $\phi_{EO}$ is so small (tens of milliradians or less), the value of m (proportional to sin $\phi_c$) is essentially zero. Thus in order to have an appreciable modulation signal, some additional phase delay must be added to the laser probe beam 132. This is achieved by rotating the EO crystal 102 by a small angle θ (typically less than a degree). To operate at the optimal transmittance point ($p_a$), only 0.3 to 0.5 radians of phase delay needs to be added to the beam, which requires a tilt angle θ of less than one half of a degree. Thus, the tilt angle of the EO crystal 102 provides a stable phase shift in the laser probe beam 132, which can be exploited to enhance (such as to increase) optical modulation and therefore increase the sensor's field strength sensitivity of the quasi-longitudinal-mode sensor 1000OF, because the phase delay induced by the rotation is proportional to $(\phi)^2$, it is much less sensitive to refractive index drifts within the crystal, compared to $\phi_0$ in the conventional transverse configuration. Also, because the stable phase delay is achieved within the EO crystal 102, the second polarizer 126B (P2) is an integral part of the sensor head. This leads to the intensity of the laser probe beam 132 being modulated prior to reaching the output fiber (such as polarization maintaining fiber 112A or multimode fiber 1012; or any other optical fiber); therefore, phase delays within the output fiber do not affect the output signal of the EO crystal 102. The tilt of the EO crystal 102 functions in the same way as adding an external wave retardation plate; therefore, by tilting the EO crystal 102, the crystal's own birefringence is used to effectively act as an external wave retardation plate thereby reducing the number of optical components and insertion losses. In other words, a retardation wave-plate (such as a ⅛ wave-plate) introduced between the crystal and the polarizer (also known as an analyzer) renders the same effect of a slightly tilted EO crystal 102. Thus either approach eliminates instability problems.

Figure 10D:
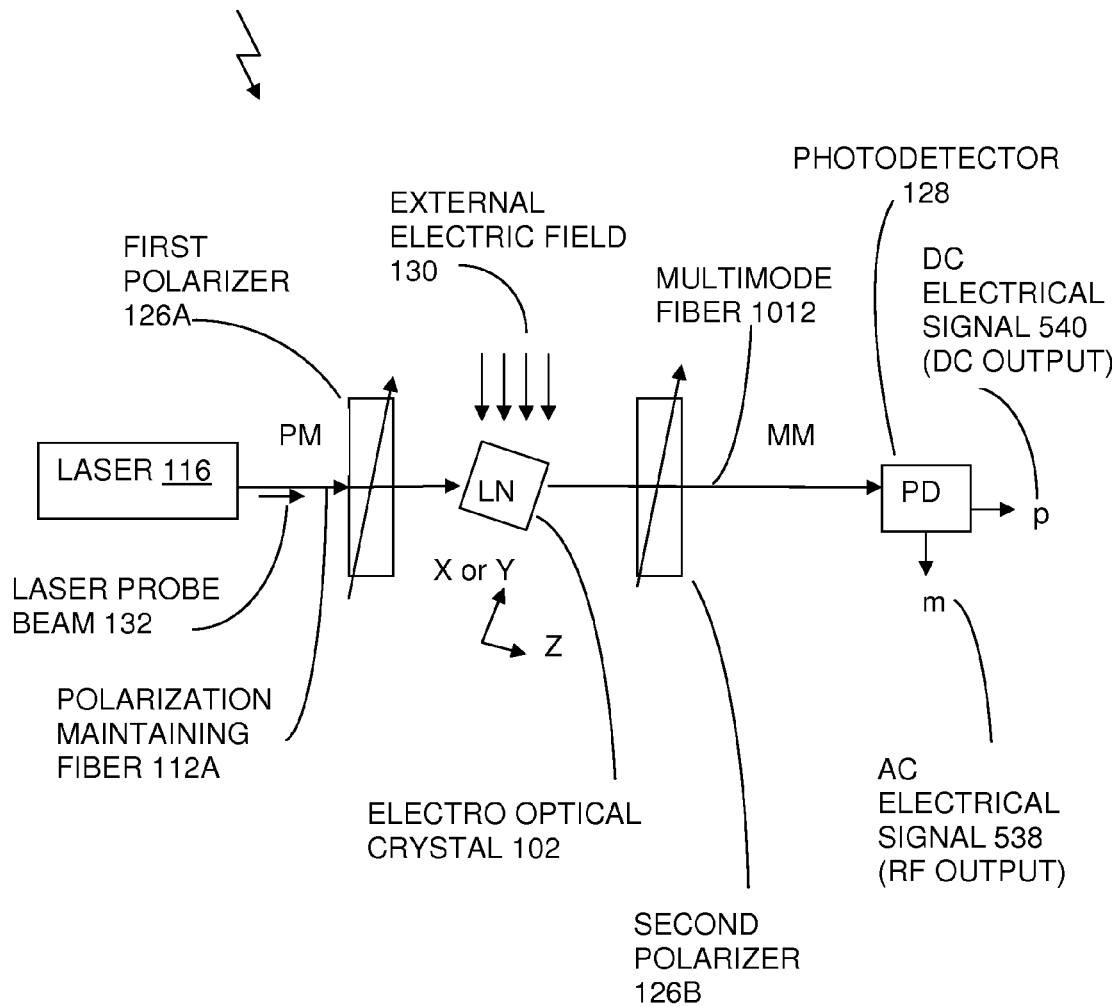
FIG. 10D illustrates the quasi-longitudinal-mode sensor with a slightly tilted EO crystal component combined with a multimode output fiber.

Referring to FIG. 10D and according to a second exemplary embodiment, within this integrated sensor design, a quasi-longitudinal-mode EO sensor 1000M is configured by replacing the output optical fiber (such as the polarization maintaining fiber 112A) with multimode (MM) fiber (hereafter "the multimode fiber 1012") which is used in place of the polarization maintaining fiber 112A (PM) for transmitting the signal to the photodetector 128 (PD). The multimode fiber 1012 is preferred because of its larger core size, which substantially reduces optical insertion losses. Compared to the conventional transverse design illustrated in FIG. 8A, the coupling efficiency is enhanced by a factor of three to five between the input optical fiber, such as the polarization maintaining fiber 112A (PM) and the output optical fiber, such as the multimode fiber 1012 (MM); furthermore, the configuration is much more stable and robust. This enhancement of the optical coupling is carried over directly to the modulation signal m, and it compensates for the smaller EO coefficient in this configuration. Thus, the second exemplary embodiment incorporation of the multimode fiber 1012 (MM) as the output fiber for the sensor head minimizes optical noise problems which could result even if the fiber is subject to mechanical vibration, which may occur during outdoor HPM T&E, because of wind or other mechanical causes; furthermore, because of this reduced optical noise feature, the measurement equipment can be kept away from the HPM field with great stability for a reasonable cost, as the quasi-longitudinal-mode EO sensor 1000M measures the external electric field 130 without interference. In addition, the use of the multimode fiber 1012 (MM) provides cost reduction up to an order of magnitude, as compared to using polarization maintaining fiber 112A, as the output fiber.

Referring again to FIG. 10D, the new sensor head incorporating the quasi-longitudinal-mode EO sensor 1000M of the second exemplary embodiment, consists of one polarization maintaining fiber 112A input fiber, two polarizers (such as the first polarizer 126A and the second polarizer 126B) in a crossed-polarization configuration, an EO crystal 102 slightly tilted, and one multimode fiber 1012 (MM) output fiber.

Figure 11:
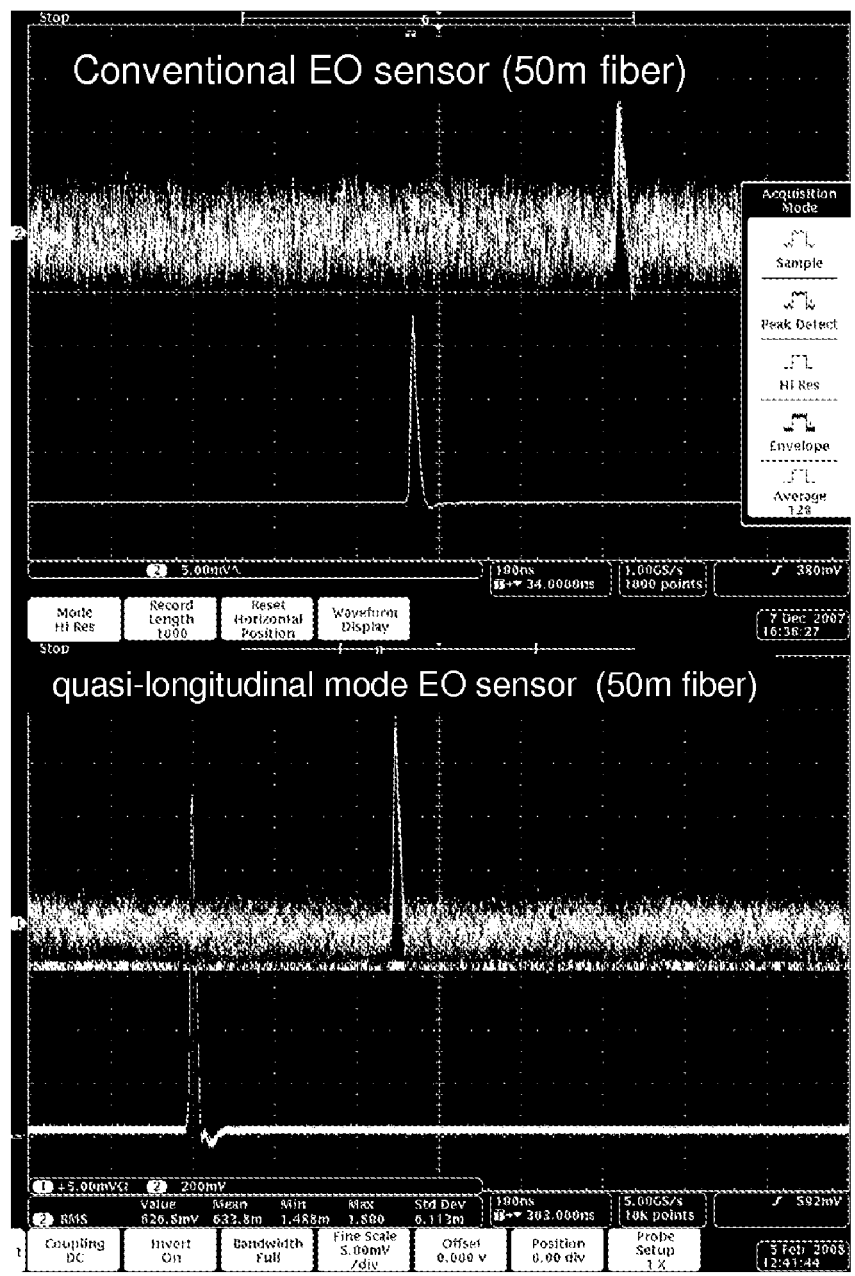
FIG. 11 illustrates a direct comparison between the output signals of a conventional EO sensor (FIG. 8A) and the quasi-longitudinal-mode sensor (FIG. 10A).

FIG. 11 provides a direct comparison between the output signals of a conventional transverse EO sensor, such as EO sensor 200 (see FIG. 2) and/or (FIG. 8A) and the quasi-longitudinal-mode sensor 1000M (FIG. 10D). For both input and output, 50 m optical fibers were used, and the external electric field 130 applied to both was identical. It can be seen that in spite of its weaker EO coefficient, the quasi-longitudinal mode sensor 1000M yields a modulation-amplitude that is larger than the previous transverse sensor design does, because of its greater optical coupling capability of the quasi-longitudinal mode sensor 1000M. In addition, although both sensors were biased at their optimal transmittance point ($p_a$), the optical noise level is lower in the quasi-longitudinal-mode sensor 1000M, due to the absence of phase noise in the output fiber.

Figure 10E:
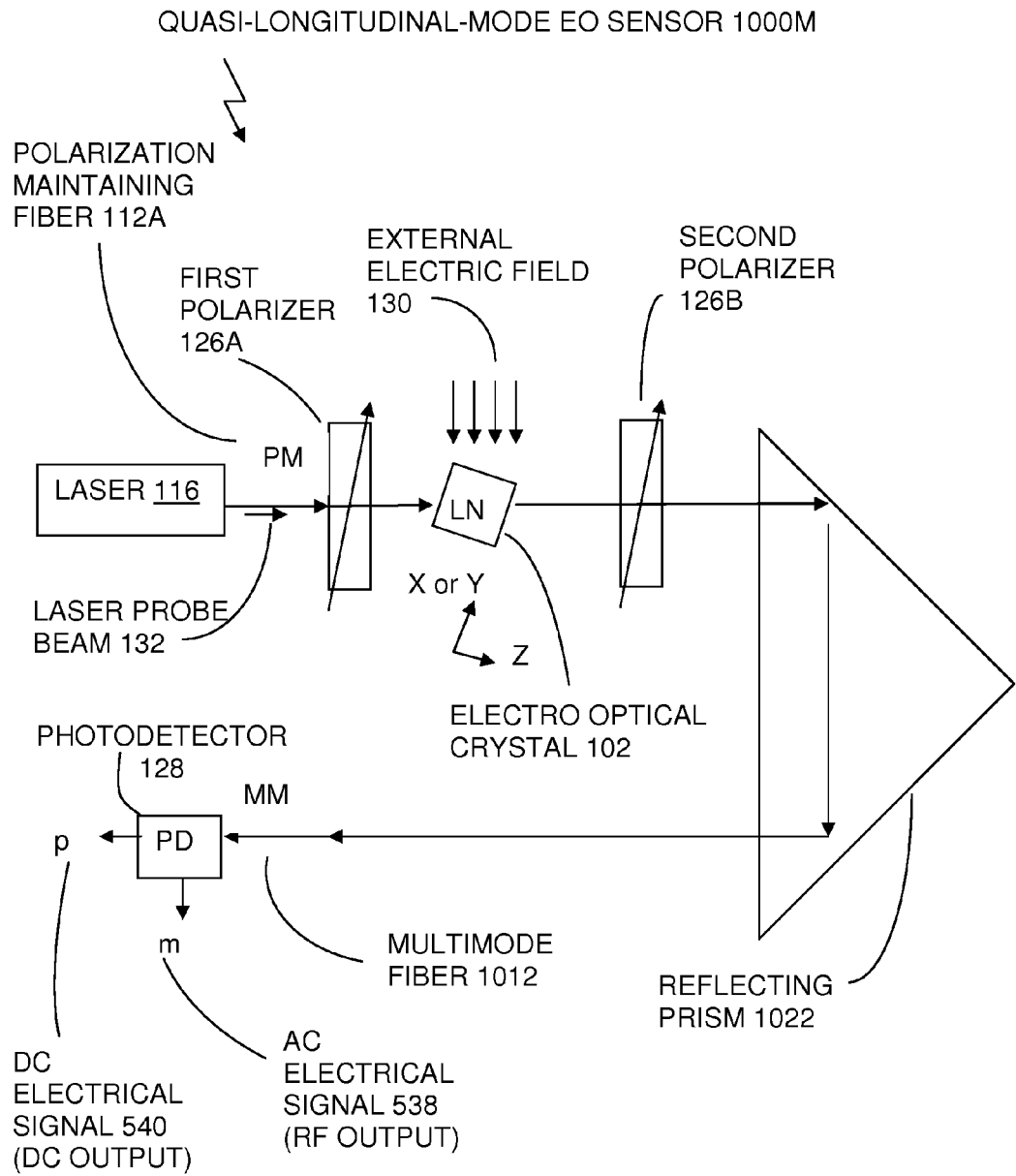
FIG. 10E shows a wand configuration variation of the sensor head illustrated in FIG. 10D.

Referring to FIG. 10E, a variation of sensor head configuration shown in FIG. 10D can be implemented by introducing a reflecting prism (1022) in between the EO crystal (102) (LN) and the second collimating lens. With this configuration, all optical fibers (112A and 1012) are in the same direction (i.e., collinear) so that the sensor head (101) and all optical fibers (112A and 1012) are all aligned, a wand configuration. The sensor head (101) can go through a small hole (or area) without damaging and/or breaking the optical fiber, such as the multimode fiber (1012).

In summary, the sensitivity of this new EO sensor is not limited by the length of optical fiber used in the measurement. By modulating the probe beam along a crystalline direction of low birefringence, phase noise and compensation optics are eliminated while sensitivity is greatly enhanced. Furthermore, this new quasi longitudinal mode electro optic sensor device will find practical use as an HPM field sensor and will facilitate HPM test and evaluation. Since the device does not generate significant interference with the field that it measures, it will solve a current major problem of the HPM T&E community. The integrated-sensor-head design and the use of an MM output fiber greatly simplify construction, reduce cost, improve robustness, reduce noise level (thereby increasing sensitivity), eliminate dead time associated with adjustments in the compensation optics, and improve the stability and reliability of the EO sensor.

Additionally, the integrated optics in the new sensor reduces the amount of instrumentation, making it much easier to operate and more accommodating for outdoor field testing. In an actual field data generated by the modified sensor, a spatial map of the electric field was obtained in the radiative near field region using a microwave horn antenna and gigahertz transverse electromagnetic (GTEM) cell. The measurements were carried out remotely, using 50 meters lengths of optical fibers. Because the sensor is all-dielectric, it can be placed directly in the radiating path with minimal field perturbations and without the need for probe corrections. Such data can be used for noninvasive measurements including total beam power, antenna gain, near and/or far fields. From this data, the noise equivalent field (NEF) of an 8 mm KD*P sensor was measured at $10 \text{ mV/m-Hz}^{1/2}$. This value is consistent with the theoretical NEF based on Johnson and shot noise limit of the photodetector. Further sensitivity improvement must therefore be achieved by increasing the modulation depth through intrinsic factors such as increasing the crystal length, lowering the laser wavelength, or other techniques.

Furthermore, because electromagnetic fields consist of both electric fields and magnetic fields, it follows that to fully characterize an electromagnetic field, additional embodiments of the EO devices discussed here can be improved upon by integrating EO devices with magneto-optic (MO) devices, such as, electro optic/magneto optic (EO/MO) integration, for simultaneous E-Field and H-Field (magnetic field) measurements, along with sensor head miniaturization, for use in small cavities. Further embodiments will implement near and far field testing of high power microwaves greater than $10^5$ watts.

While the exemplary embodiments have been particularly shown and described with reference to preferred embodiments thereof, it will be understood by those skilled in the art that the preferred embodiments have been presented by way of example only, and not limitation; furthermore, various changes in form and details can be made therein without departing from the spirit and scope of the invention. Thus, the breadth and scope of the present exemplary embodiments should not be limited by any of the above described preferred exemplary embodiments, but should be defined only in accordance with the following claims and their equivalents. All references cited herein, including issued U.S. patents, or any other references, are each entirely incorporated by reference herein, including all data, tables, figures, and text presented in the cited references. Also, it is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

What is claimed is:

1. An apparatus for measuring an electric field while minimally perturbing the electric field being measured, the apparatus comprising:
   a probe beam stage having a laser, wherein the laser emits a laser probe beam passing through an electro optic crystal, having an optic axis, exposed to the electric field;
   a sensor head forming an electro optic sensor that detects the electric field, wherein the sensor head is optically coupled to the probe beam stage by a first optical fiber lead, wherein the sensor head includes a holder, wherein residing in the holder is a first polarizer, a second polarizer, and the electro optic crystal between two collimating lenses, wherein the electro optic crystal is disposed in the holder at a tilt angle Theta about the optic axis of the electro optic crystal, such that the tilt angle Theta is subtended between the optic axis and the path of the probe beam; and
   a photodetector that receives the laser probe beam and converts the laser probe beam into an electrical signal which is displayed on an RF readout instrument obtaining measurements of the electric field for system warnings, activation of countermeasures, and activation of communications systems, and wherein the photodetector is optically coupled to the sensor head by a second optical fiber lead.

2. The apparatus according to claim 1, wherein the tilt angle Theta has a tilt range of about zero degrees up to about ten degrees, with the same output result within the tilt range of about zero degrees up to about ten degrees.

3. The apparatus according to claim 1, wherein the tilt angle Theta typically operates at a tilt range of less than about one degree and up to about three degrees.

4. The apparatus according to claim 1, wherein the tilt angle Theta provides a stable phase shift in the laser probe beam, which increases optical modulation and field strength sensitivity of the electro optic sensor.

5. The apparatus according to claim 1, wherein the RF readout instrument includes one or more of a digital multimeter, a specialized network analyzer, a spectrum analyzer, a vector analyzer, a power analyzer and an oscilloscope.

6. The apparatus according to claim 1, wherein the holder is a non-metallic holder.

7. The apparatus according to claim 6, wherein the non-metallic holder is a ceramic holder.

8. The apparatus according to claim 1, wherein the second polarizer integrated into the holder in the sensor head is disposed close to the electro optic crystal at a distance ranging from about zero millimeters to about ten millimeters, and because of the tilt angle Theta of the electro optic crystal, a requirement is eliminated for a plurality of additional optical components.

9. The apparatus according to claim 8, wherein the additional optical components, for which the requirement is eliminated, include: a quarter wave plate, and an external wave retardation plate thereby reducing a plurality of optical components and insertion losses.

10. An apparatus for measuring an electric field while minimally perturbing the electric field being measured, the apparatus comprising:
    a probe beam stage having a laser, wherein the laser emits a laser probe beam passing through an electro optic crystal, having an optic axis, exposed to the electric field;
    a sensor head forming a quasi-longitudinal-mode EO sensor that detects the electric field, wherein the sensor head is optically coupled to the probe beam stage by a first polarization maintaining optical fiber lead, wherein the sensor head includes a holder, wherein residing in the holder is a first polarizer, a second polarizer in a crossed-polarization configuration, and the electro optic crystal between two collimating lenses, wherein the electro optic crystal is disposed in the holder at a tilt angle Theta about the optic axis of the electro optic crystal, such that the tilt angle Theta is subtended between the optic axis and the path of the probe beam; and a photodetector that receives the laser probe beam and converts the laser probe beam into an electrical signal which is displayed on an RF readout instrument obtaining measurements of the electric field for system warnings, activation of countermeasures, and activation of communications systems, and wherein the photodetector is optically coupled to the sensor head by a multimode optical fiber lead.

11. The apparatus according to claim 10, wherein the tilt angle Theta typically operates at a tilt range of less than about one degree and up to about three degrees.

12. The apparatus according to claim 10, wherein the tilt angle Theta provides a stable phase shift in the laser probe beam, which increases optical modulation and field strength sensitivity of the electro optic sensor.

13. The apparatus according to claim 10, wherein the multimode fiber and the electro optic crystal disposed in the holder at a tilt angle minimize optical noise.

14. The apparatus according to claim 10, wherein the RF readout instrument includes one or more of a digital multimeter, a specialized network analyzer, a spectrum analyzer, a vector analyzer, a power analyzer and an oscilloscope.

15. The apparatus according to claim 10, wherein the holder is a non-metallic holder.

16. The apparatus according to claim 15, wherein the non-metallic holder is a ceramic holder.

17. The apparatus according to claim 10, wherein the second polarizer integrated into the holder in the sensor head is disposed close to the electro optic crystal at a distance ranging from about zero millimeters to about ten millimeters, and because of the tilt angle Theta of the electro optic crystal, a requirement is eliminated for a plurality of additional optical components.

18. The apparatus according to claim 17, wherein the additional optical components, for which the requirement is eliminated, include: a quarter wave plate, and an external wave retardation plate thereby reducing a plurality of optical components and insertion losses.

19. A system for detecting and measuring an applied electric field using a quasi-longitudinal-mode EO sensor, the system comprising:

a probe beam stage having a laser, wherein the laser emits a laser probe beam passing through an electro optic crystal, having an optic axis, exposed to the electric field;

a sensor head forming an electro optic sensor that detects the electric field, wherein the sensor head is optically coupled to the probe beam stage by a first optical fiber lead, wherein the sensor head includes a holder, wherein residing in the holder is a first polarizer, a second polarizer, and the electro optic crystal between two collimating lenses, wherein the electro optic crystal is disposed in the holder at a tilt angle Theta about the optic axis of the electro optic crystal, such that the tilt angle Theta is subtended between the optic axis and the path of the probe beam;

a photodetector that receives the laser probe beam and converts the laser probe beam into an electrical signal which is displayed on an RF readout instrument; obtaining measurements of the electric field for system warnings, activation of countermeasures, and activation of communications systems, and wherein the photodetector is optically coupled to the sensor head by a second optical fiber lead; and a computer controller having computer a executable program, and wherein when the computer executable program is executed by the computer controller, the computer executable program causes the computer controller to automatically measure an intensity of the intensity modulated laser probe beam converted into the electrical signal which is displayed on the RF readout instrument obtaining measurements of the electric field for system warnings, activation of countermeasures, and activation of communications systems, and wherein the photodetector is optically coupled to the sensor head by a second optical fiber lead.

20. The system according to claim 19, further comprising a reflecting prism positioned between the electro optic crystal and the second collimating lens, wherein all optical fibers are positioned in the same collinear direction so that the sensor head and all optical fibers are aligned and are configured as a wand.

* * * * *